(12) United States Patent
Kato et al.

(10) Patent No.: US 9,631,081 B2
(45) Date of Patent: *Apr. 25, 2017

(54) IMPRINT MATERIAL

(71) Applicant: NISSAN CHEMICAL INDUSTRIES, LTD., Tokyo (JP)

(72) Inventors: Taku Kato, Funabashi (JP); Junpei Kobayashi, Funabashi (JP); Keisuke Shuto, Funabashi (JP); Masayoshi Suzuki, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 312 days.

This patent is subject to a terminal disclaimer.

(21) Appl. No.: 14/009,998

(22) PCT Filed: Apr. 16, 2013

(86) PCT No.: PCT/JP2013/061286
§ 371 (c)(1),
(2) Date: Oct. 4, 2013

(87) PCT Pub. No.: WO2013/161627
PCT Pub. Date: Oct. 31, 2013

(65) Prior Publication Data
US 2014/0216538 A1 Aug. 7, 2014

(30) Foreign Application Priority Data
Apr. 27, 2012 (JP) ................. 2012-103964

(51) Int. Cl.
| | | |
|---|---|---|
| C08L 33/14 | (2006.01) |
| H01L 27/146 | (2006.01) |
| C08F 2/44 | (2006.01) |
| C08F 2/50 | (2006.01) |
| G03F 7/00 | (2006.01) |
| G03F 7/004 | (2006.01) |
| G03F 7/027 | (2006.01) |
| G03F 7/075 | (2006.01) |
| B32B 3/30 | (2006.01) |
| C08L 33/08 | (2006.01) |
| H01L 31/0216 | (2014.01) |
| B82Y 10/00 | (2011.01) |
| B82Y 40/00 | (2011.01) |
| C08F 222/10 | (2006.01) |

(52) U.S. Cl.
CPC ........... *C08L 33/14* (2013.01); *B32B 3/30* (2013.01); *B82Y 10/00* (2013.01); *B82Y 40/00* (2013.01); *C08F 2/44* (2013.01); *C08F 2/50* (2013.01); *C08L 33/08* (2013.01); *G03F 7/0002* (2013.01); *G03F 7/0048* (2013.01); *G03F 7/027* (2013.01); *G03F 7/0757* (2013.01); *H01L 27/14625* (2013.01); *H01L 31/02167* (2013.01); *C08F 222/1006* (2013.01); *Y10T 428/24479* (2015.01); *Y10T 428/24612* (2015.01); *Y10T 428/24802* (2015.01)

(58) Field of Classification Search
CPC ................ H01L 27/14625; B32B 3/30; C08F 222/1006; Y10T 428/24802
See application file for complete search history.

(56) References Cited

U.S. PATENT DOCUMENTS 5,772,905 A 6/1998 Chou

FOREIGN PATENT DOCUMENTS

| | | | | |
|---|---|---|---|---|
| JP | A-11-209717 | | 8/1999 | |
| JP | A-2005-248173 | | 9/2005 | |
| JP | A-2008-105414 | | 5/2008 | |
| JP | 2008-202022 A | * | 9/2008 | ................ C08F 2/44 |
| JP | A-2008-202022 | | 9/2008 | |
| JP | A-2008-238416 | | 10/2008 | |
| JP | 2009206197 A | * | 9/2009 | ........... H01L 21/027 |
| JP | A-2010-100785 | | 5/2010 | |
| JP | A-2010-126609 | | 6/2010 | |
| JP | A-2011-066370 | | 3/2011 | |
| JP | A-2011-082347 | | 4/2011 | |
| JP | 2011111553 A | * | 6/2011 | ................ C08F 2/50 |
| JP | A-2011-111553 | | 6/2011 | |
| JP | A-2012-041521 | | 3/2012 | |
| WO | WO 2007/040159 A1 | | 4/2007 | |
| WO | WO 2011/155365 A1 | | 12/2011 | |

OTHER PUBLICATIONS

Jun. 11, 2013 International Search Report issued in International Application No. PCT/JP2013/061286.

* cited by examiner

Primary Examiner — Betelhem Shewareged
(74) Attorney, Agent, or Firm — Oliff PLC

(57) ABSTRACT

An imprint material which is in a transparent and homogeneous varnish form, is not peeled off in cross-cut tests, in which the adhesion of coating films is evaluated, and forms films that can have a mold release force of 0.5 g/cm or less. An imprint material including: a component (A): a compound containing at least one alkylene oxide unit having carbon atom number of 2, 3 or 4 and at least two polymerizable groups; a component (B): a photopolymerization initiator; a component (C): a solvent that swells or dissolves a surface portion of a film base material to which the imprint material is applied; and a component (D): a silicone compound.

17 Claims, No Drawings

IMPRINT MATERIAL

TECHNICAL FIELD

The present invention relates to an imprint material (imprint film-forming composition) and a film which is manufactured using the above material and which has a pattern transferred thereto. More particularly, the invention relates to an imprint material which makes a formed film highly adhesive to film base materials and easily releasable from molds, and a film which is manufactured using the above material and has a pattern transferred thereto.

BACKGROUND ART

In 1995, Professor Chou of Princeton University et al. proposed a new technique called nanoimprint lithography (Patent Document 1). Nanoimprint lithography refers to a technique in which a mold having a pattern is brought into contact with a base material having a resin film formed thereon, and while the resin film is pressed, heat or light is applied as an external stimulus to the resin film to form a target pattern in the cured resin film. Nanoimprint lithography has an advantage that enables nano-scale work to be done with ease at low costs in comparison to photolithography and the like conventionally used when manufacturing semiconductor devices.

Therefore, nanoimprint lithography is a technique expected to be applied to manufacturing of semiconductor devices, optodevices, displays, recording media, biochips and the like instead of a photolithography technique, and thus a variety of reports have been made regarding curable compositions for photo nanoimprint lithography which are used in nanoimprint lithography (Patent Documents 2 and 3).

In addition, as a method for mass production of pattern-transferred films with high efficiency in photo nanoimprint lithography, roll-to-roll processing has been proposed. In the roll-to-roll processing conventionally proposed for photo nanoimprint lithography, the prevalent method is to use a flexible film as a base material and to use, as an imprint material, a solvent-free material, in which a solvent is not added in order to suppress changes in the pattern dimensions.

Meanwhile, in technical fields other than photo nanoimprint lithography, there have been reports regarding a method in which sufficient adhesion to films (base materials) is achieved by adding a solvent (Patent Documents 4 and 5).

For photo nanoimprint lithography, a fact has been pointed out that there are cases in which, after imprinting, the imprint material is attached to the mold, which is a metallic mold so that a target pattern shape cannot be obtained. Therefore, there has been a report regarding a technique to obtain the target pattern shape, in which a silicone compound is added to the imprint material as a mold release property improver so as to improve the mold release property (Patent Document 6). In the document, excellent detachability between a coating film and the mold is described as one of causes that develop a favorable imprint property, and, in Examples, the imprint property is evaluated by evaluating the pattern transfer rate of the mold shape through microscopic observation. Furthermore, there is a report regarding a technique in which a silicone compound is added for the purpose of improving the abrasion property of a film surface (Patent Document 7).

PRIOR ART DOCUMENTS

[Patent Document 1] Specification of U.S. Pat. No. 5,772,905
[Patent Document 2] Japanese Patent Application Publication No. 2008-105414 (JP 2008-105414 A)
[Patent Document 3] Japanese Patent Application Publication No. 2008-202022 (JP 2008-202022 A)
[Patent Document 4] Japanese Patent Application Publication No. 11-209717 (JP 11-209717 A)
[Patent Document 5] Japanese Patent Application Publication No. 2005-248173 (JP 2005-248173 A)
[Patent Document 6] Japanese Patent Application Publication No. 2011-66370 (JP 2011-66370 A)
[Patent Document 7] WO2007/040159

SUMMARY OF THE INVENTION

Problem to be Solved by the Invention

As described above, a variety of materials have been hitherto disclosed as materials for nanoimprint lithography (hereinafter referred to simply as "imprint materials" in the present specification), but there has been no specific study or report regarding materials that are sufficiently adhesive to film base materials and require a small mold release force, that is, allow molds to be easily detached from cured resin films. In addition, silicone compounds serving as the mold release property improver have a drawback of low compatibility with a variety of components that are generally used for imprint materials. As described above, there has been no report until now regarding materials that are compatible with mold release property improvers, and, furthermore, that have a mold release property which is not qualitatively evaluated through microscopic observation of obtained pattern shapes, but evaluated using a quantified mold release force (detachment force required when releasing from molds).

The present invention has been made based on the above circumstances, and objects of the invention are to provide an imprint material which is configured of components that are sufficiently compatible with each other so as to be in a homogeneous form, makes resin films formed using the material highly adhesive to film base materials, and allows the resin films to be easily detached from molds when released from the molds, that is, an imprint material that can form films that are easily releasable from molds, and to provide a film which is manufactured using the above material and has a pattern transferred thereto. Specifically, the object is to provide an imprint material which is in a transparent and homogeneous varnish form, is not peeled off in cross-cut tests, in which the adhesion of coating films is evaluated, and forms films that can have a mold release force of 0.5 g/cm or less.

Means for Solving the Problem

As a result of carrying out thorough studies in order to achieve the above objects, the inventors obtained a surprising finding that, when a material containing: a compound that contains an alkylene oxide unit having carbon atom number of 2, 3 or 4 and at least two polymerizable groups; a photopolymerization initiator; a silicone compound which has been hitherto identified as having a poor compatibility; and a solvent which was not commonly used in the past because pattern dimensions were easily changed, is used as an imprint material, the material can form homogeneous coating films in a transparent and homogeneous varnish form, and the mold release force measured when a cured film to which a pattern shape of a mold has been transferred by applying the material on a film base material and photocuring is detached from a surface of the mold, which has the pattern shape, is significantly decreased, and completed the present invention.

That is, a first aspect of the present invention relates to an imprint material comprising: a component (A): a compound that contains at least one alkylene oxide unit having carbon atom number of 2, 3 or 4 and at least two polymerizable groups; a component (B): a photopolymerization initiator; a component (C): a solvent that swells or dissolves a surface portion of a film base material to which the imprint material is applied; and a component (D): a silicone compound.

A second aspect relates to the imprint material according to the first aspect in which the compound of the component (A) is a compound that contains two or more of at least one group selected from a group consisting of an acryloyloxy group, a methacryloyloxy group, a vinyl group and an allyl group as the polymerizable groups.

A third aspect relates to the imprint material according to the first aspect in which the compound of the component (A) is a compound that contains one or more of at least one selected from ethylene oxide, propylene oxide and butylene oxide as the alkylene oxide unit.

A fourth aspect relates to the imprint material according to any one of the first to third aspects in which the component (B) includes 2,4,6-trimethylbenzoyl-diphenyl-phosphine oxide, 1-hydroxy-cyclohexyl-phenyl-ketone or 2-hydroxy-2-methyl-1-phenyl-propane-1-one.

A fifth aspect relates to the imprint material according to any one of the first to fourth aspects characterized in that the component (C) contains at least one selected from a group consisting of methyl ethyl ketone, methyl isobutyl ketone, ethyl acetate, cycylohexanone and propylene glycol monomethyl ether.

A sixth aspect relates to the imprint material according to any one of the first to fifth aspects characterized in that a proportion of a solid content defined as all the components of the imprint material excluding the component (C) is 10% by mass to 80% by mass with respect to a total mass of the imprint material.

A seventh aspect relates to the imprint material according to any one of the first to sixth aspects in which the film base material is made of triacetyl cellulose, poly(ethylene terephthalate), poly(methylmethacrylate) or cycloolefin (co) polymer.

An eighth aspect relates to the imprint material according to any one of the first to seventh aspects in which adhesion between a cured film obtained when the imprint material is applied on the film base material and photocured and the film base material is 100/100 in a test evaluation in accordance with JIS K5400, and, in a test in which the imprint material is applied on the film base material, a coating film on the film base material is adhered to a surface of a mold, which has a pattern shape, subsequently, the coating film is photocured, and then the cured coating film on the film base material is detached from the surface of the mold which has a pattern shape at 90°, a measured mold release force, that is, a value obtained by converting a load required to detach the cured coating film on the film base material from the surface of the mold, which has a pattern shape, into a load per 1 cm of a lateral width of the film base material, is larger than 0 g/cm to 0.5 g/cm or less.

A ninth aspect relates to an imprint method comprising: a step of applying the imprint material according to any one of the first to eighth aspects on a film base material so as to obtain a coating film; a step of drying the coating film; a step of pressing a mold against the dried coating film and applying pressure, or of heating the dried coating film while pressing the mold against the coating film and applying pressure; a step of radiating light that cures the coating film with the coating film and the mold being in contact with each other so as to form a cured film; and a step of detaching the formed cured film from the mold.

A tenth aspect relates to the imprint method according to the ninth aspect in which, in the drying step, a drying temperature is selected from a range of 60° C. to 150° C.

An eleventh aspect relates to a film which is manufactured using the imprint material according to any one of the first to eighth aspects, and has a pattern transferred thereto.

A twelfth aspect relates to an optical member comprising the pattern-transferred film according to the eleventh aspect on a base material.

A thirteenth aspect relates to a solid-state imaging device comprising the pattern-transferred film according to the eleventh aspect on a base material.

A fourteenth aspect relates to an LED device comprising the pattern-transferred film according to the eleventh aspect on a base material.

A fifteenth aspect relates to a semiconductor element comprising the pattern-transferred film according to the eleventh aspect.

A sixteenth aspect relates to a solar cell comprising the pattern-transferred film according to the eleventh aspect.

A seventeenth aspect relates to a display comprising the pattern-transferred film according to the eleventh aspect.

An eighteenth aspect relates to an electronic device comprising the pattern-transferred film according to the eleventh aspect.

Effects of the Invention

Since the imprint material of the present invention contains a compound containing an alkylene oxide unit having carbon atom number of 2, 3 or 4 and at least two polymerizable groups in a molecule, a photopolymerization initiator, a solvent, and a silicone compound, a cured film manufactured using the imprint material obtains sufficient adhesion to a film base material and is easily releasable from molds.

Also, since the imprint material of the present invention is photocurable and does not allow the pattern to be peeled off even in some parts when a mold is released, a film on which a desired pattern is accurately formed can be obtained. Therefore, it is possible to form favorable photoimprint patterns.

Furthermore, while the imprint material of the present invention contains a silicone compound, of which a poor compatibility was considered a problem for conventional imprint materials, it is possible to obtain the material in a transparent and homogeneous varnish form, to suppress layers from being separated over time, and to provide the material with favorable product stability. Therefore, accordingly, the imprint material of the present invention can form homogeneous coating films, which makes it possible to supply highly stable products.

In addition, since the film which is manufactured using the imprint material of the present invention and has a pattern transferred thereto contains a silicone compound, the film has a small mold release force with respect to a surface of the mold, which has a pattern. The mold release force that can be suppressed at a low level can suppress the attachment of the imprint material to molds, which are metallic molds, and the consequent deterioration of molds, and also solves a problem of the shortening of the mold durability caused by a mold release agent, which is used in the mold release treatment, gradually migrating to the imprint material. Therefore, the pattern-transferred film of the present invention having a small mold release force with respect to the surface of the mold, which has a pattern shape, allows the mold durability to be extended, and allows an intended base material with a pattern to be produced at low cost and with high efficiency.

In addition, since the imprint material of the present invention is in a homogeneous varnish form as described above, there is no variation of components in surfaces of obtained cured films. Thus, the optical characteristics of the films obtained at the initial phase and later phase of a line in the roll-to-roll processing are stabilized, which leads to an improvement in yield in manufacturing films and makes it becomes possible to improve production efficiency.

In addition, the imprint material of the present invention can be used to form a film on a film base material, provides sufficient adhesion between the formed film and the film base material, and provides a small mold release force to the film. Therefore, a pattern-transferred film formed after imprinting can be preferably used to manufacture optical members, such as solid-state imaging devices, solar cells, LED devices and displays.

Furthermore, the imprint material of the present invention allows curing rate, dynamic viscosity, film thickness, adhesion to the base material and mold release force to be controlled by altering the types and proportions of the compound of the component (A) containing an alkylene oxide unit having carbon atom number of 2, 3 or 4 and at least two polymerizable groups and/or a silicone compound and/or a solvent. Therefore, the imprint material of the present invention enables material design based on the types of devices manufactured and the types of exposure process and baking process, and can increase process margins. Thus, the imprint material can be preferably used to manufacture optical members.

MODES FOR CARRYING OUT THE INVENTION

The present invention is an imprint material which contains (A) a compound that contains at least one alkylene oxide unit having carbon atom number of 2, 3 or 4 and at least two polymerizable groups, (B) a photopolymerization initiator, (C) a solvent, and (D) a silicone compound, and can further contain (meth)acrylate and/or urethane (meth)acrylate which contains at least two polymerizable groups but does not contain an alkylene oxide unit having carbon atom number of 2, 3 or 4 as a component (E) if desired, and other components if desired.

Since the imprint material of the present invention is formed by the above configuration, the imprint material allows cured films formed of the imprint material to obtain strong adhesion to film base materials, and to have a low mold release force.

Hereinafter, the components will be described in detail.

<Component (A)>

The compound of the component (A) refers to a compound which contains one or more alkylene oxide units having carbon atom number of 2, 3 or 4 solely or in combination in a molecule and contains at least two polymerizable groups; in short, contains polymerizable groups at molecule terminals. The component (A) contained in the present invention contributes to enhancing the slippage of the surface of a pattern-transferred film, and thus to decreasing a mold release force generated when the film is detached from the surface of a mold, which has a pattern shape.

The alkylene oxide unit is preferably ethylene oxide ($-CH_2CH_2O-$), propylene oxide ($-CH(CH_3)CH_2O-$), ($-CH_2CH_2CH_2O-$) or butylene oxide ($-CH_2CH_2CH_2CH_2O-$).

The polymerizable group refers to, for example, at least one organic group selected from a group consisting of an acryloyloxy group, a methacryloyloxy group, a vinyl group and an allyl group. Here, the acryloyloxy group is sometimes expressed as an acryloxy group, and the methacryloyloxy group is sometimes expressed as a methacryloxy group. In addition, ethylene oxide is sometimes expressed as dimethylene oxide, propylene oxide is sometimes expressed as trimethylene oxide, and butylene oxide is sometimes expressed as tetramethylene oxide.

Examples of the compound which is the component (A) include ethylene glycol diacrylate, ethylene glycol dimethacrylate, polyethylene glycol diacrylate, polyethylene glycol dimethacrylate, ethoxylated bisphenol A diacrylate, ethoxylated bisphenol A dimethacrylate, ethoxylated trimethylolpropane triacrylate, ethoxylated trimethylolpropane trimethacrylate, ethoxylated pentaerythritol tetraacrylate, ethoxylated pentaerythritol tetramethacrylate, ethoxylated dipentaerythritol hexaacrylate, ethoxylated dipentaerythritol hexamethacrylate, propylene glycol diacrylate, propylene glycol dimethacrylate, polypropylene glycol diacrylate, polypropylene glycol dimethacrylate, tetramethylene glycol diacrylate, tetramethylene glycol dimethacrylate, polytetramethylene glycol diacrylate, polytetramethylene glycol dimethacrylate, polyethylene oxide polypropylene oxide diacrylate, polyethylene oxide polypropylene oxide dimethacrylate, polyethylene oxide polypropylene oxide bisphenol A diacrylate, polyethylene oxide polypropylene oxide bisphenol A dimethacrylate, polyethylene oxide polybutylene oxide diacrylate and polyethylene oxide polybutylene oxide dimethacrylate.

The above compound is commercially available, and specific examples thereof include NK ESTER A-200, NK ESTER A-400, NK ESTER A-600, NK ESTER A-1000, NK ESTER A-1500, NK ESTER A-2000, NK ESTER 1G, NK ESTER 2G, NK ESTER 3G, NK ESTER 4G, NK ESTER 9G, NK ESTER 14G, NK ESTER 23G, NK ESTER ABE-300, NK ESTER A-BPE-4, NK ESTER A-BPE-6, NK ESTER A-BPE-10, NK ESTER A-BPE-20, NK ESTER A-BPE-30, NK ESTER BPE-80N, NK ESTER BPE-100N, NK ESTER BPE-200, NK ESTER BPE-500, NK ESTER BPE-900, NK ESTER BPE-1300N, NK ESTER A-GLY-3E, NK ESTER A-GLY-9E, NK ESTER A-GLY-20E, NK ESTER A-TMPT-3EO, NK ESTER A-TMPT-9EO, NK ESTER ATM-4E, NK ESTER ATM-35E, NK ESTER APG-100, NK ESTER APG-200, NK ESTER APG-400, NK ESTER APG-700, NK ESTER 3PG, NK ESTER 9PG, NK ESTER A-PTMG-65, NK ESTER A-1000PER, NK ESTER 1206PE, NK ESTER A-B1206PE (all manufactured by Shin-Nakamura Chemical Co., Ltd.), KAYARAD (registered trademark) DPEA-12, KAYARAD PEG400DA, KAYARAD THE-330, KAYARAD RP-1040 (all manufactured by Nippon Kayaku Co., Ltd.), M-210, M-350 (all manufactured by Toagosei Co., Ltd.), and FANCRYL (registered trademark) FA-P240A, FANCRYL FA-P270A and FANCRYL FA-023M (all manufactured by Hitachi Chemical Co., Ltd.).

The compound of the component (A) can be used solely or in combination of two or more.

In the component (A) of the present invention, the content of the alkylene oxide unit is not particularly limited as long as the intended effects of the present invention are not impaired.

<Component (B)>

The photopolymerization initiator which is the component (B) generates radicals through light radiation and initiates the polymerization of photopolymerizable groups in the imprint material.

The photopolymerization initiator which is the component (B) is not particularly limited as long as the photopolymerization initiator absorbs light from light sources used during photocuring, and examples thereof include organic peroxides such as tert-butyl peroxy-iso-butyrate, 2,5-dimethyl-2,5-bis(benzoyldioxy)hexane, 1,4-bis[α-(tert-butyldioxy)-iso-propoxy]benzene, di-tert-butylperoxide, 2,5-dimethyl-2,5-bis(tert-butyldioxy)hexane hydroperoxide, α-(isopropylphenyl)-iso-propylhydroperoxide, tert-butylhydroperoxide, 1,1-bis(tert-butyldioxy)-3,3,5-trimethylcyclohexane, butyl-4,4-bis(tert-butyldioxy) valerate, cyclohexanone peroxide, 2,2',5,5'-tetra(tert-butylperoxy carbonyl)benzophenone, 3,3',4,4'-tetra(tert-butylperoxy carbonyl)benzophenone, 3,3',4,4'-tetra(tert-amylperoxy carbonyl)benzophenone, 3,3',4,4'-tetra(tert-hexylperoxy carbonyl)benzophenone, 3,3'-bis(tert-butylperoxy carbonyl)-4,4'-dicarboxy benzophenone, tert-butylperoxy benzoate and di-tert-butyldiperoxy isophthalate; quinones such as 9,10-anthraquinone, 1-chloroanthraquinone, 2-chloroanthraquinone, octamethyl anthraquinone and 1,2-benzanthraquinone; benzoin derivatives such as methyl benzoin, benzoin ethyl ether, α-methyl benzoin and α-phenyl benzoin; alkyl phenone-based compounds such as 2,2-dimethoxy-1,2-diphenylethane-1-one, 1-hydroxy-cyclohexyl-phenyl-ketone, 2-hydroxy-2-methyl-1-phenyl-propane-1-one, 1-[4-(2-hydroxyethoxy)-phenyl]-2-hydroxy-2-methyl-1-propane-1-one, 2-hydroxy-1-[4-{4-(2-hydroxy-2-methyl-propionyl)benzyl}-phenyl]-2-methyl-propane-1-one, phenylglyoxylic acid methyl ester, 2-methyl-1-[4-(methylthio)phenyl]-2-morpholinopropane-1-one, 2-benzyl-2-dimethylamino-1-(4-morpholino phenyl)-butane-1-one and 2-dimethylamino-2-(4-methyl-benzyl)-1-(4-morpholin-4-yl-phenyl)-butane-1-one; acylphosphine oxide-based compounds such as bis(2,4,6-trimethylbenzoyl)-phenylphosphine oxide and 2,4,6-trimethylbenzoyl-diphenyl-phosphine oxide; oxime ester-based compounds such as 1,2-octanedione, 1-[4-(phenylthio)-,2-(O-benzoyloxime)] and ethanone, 1-[9-ethyl-6-(2-methylbenzoyl)-9H-carbazole-3-yl]-,1-(O-acetyloxime).

The imprint material of the present invention is sometimes subjected to a process of being photocured through a film base material. At this time, some of the wavelengths of light radiated from a light source are cut by the film, and therefore, there is no particular limitation as long as photopolymerization initiators that absorb light having wavelengths outside the wavelength range of the cut light are selected. However, 2,4,6-trimethylbenzoyl-diphenyl-phosphine oxide, 1-hydroxy-cyclohexyl-phenyl-ketone or 2-hydroxy-2-methyl-1-phenyl-propane-1-one is preferable from the viewpoint of favorable solubility in solvents and favorable transmittance of films produced using the imprint material, and, in particular, 2,4,6-trimethylbenzoyl-diphenyl-phosphine oxide can be preferably used.

The above compound is commercially available, and specific examples thereof include IRGACURE (registered trademark) 651, IRGACURE 184, IRGACURE 500, IRGACURE 2959, IRGACURE 127, IRGACURE 754, IRGACURE 907, IRGACURE 369, IRGACURE 379, IRGACURE 379EG, IRGACURE 819, IRGACURE 819DW, IRGACURE 1800, IRGACURE 1870, IRGACURE 784, IRGACURE OXE 01, IRGACURE OXE 02, IRGACURE 250, DAROCUR (registered trademark) 1173, DAROCUR MBF, DAROCUR 4265, Lucirin (registered trademark) TPO (all manufactured by BASF Japan Ltd.), KAYACURE (registered trademark) DETX, KAYACURE MBP, KAYACURE DMB I, KAYACURE EPA, KAYACURE OA (all manufactured by Nippon Kayaku Co., Ltd.), VICURE-10, VICURE-55 (all manufactured by STAUFFER Co., LTD), ESACURE (registered trademark) KIP 150, ESACURE TZT, ESACURE 1001, ESACURE KTO 46, ESACURE KB 1, ESACURE KL 200, ESACURE KS 300, ESACURE EB 3, TRIAZINE-PMS, TRIAZINE A, TRIAZINE B (all manufactured by Nihon Siber Hegner K. K.), and ADEKA OPTOMER-N-1717, ADEKA OPTOMER-N-1414 and ADEKA OPTOMER-N-1606 (manufactured by Adeka Corporation).

The photopolymerization initiator can be used solely or in combination of two or more.

The content of the component (B) in the imprint material of the present invention is preferably 0.1 phr to 30 phr, and more preferably 1 phr to 20 phr with respect to the mass of the component (A). This is because, when the proportion is less than 0.1 phr, sufficient curability cannot be obtained, and the deterioration of the patterning characteristics and an increase in the mold release force are caused. Here, phr is the mass of the photopolymerization initiator with respect to 100 g of the mass of the component (A).

<Component (C)>

The solvent that swells or dissolves the surface portion of a film base material, which is the component (C), refers to a solvent that can swell or dissolve the outermost surface portion of a film base material that comes into contact with a coating film of the imprint material during a step of applying the imprint material on a film base material and a step of drying the imprint material. The solvent plays a role of improving adhesion between a film base material and a cured film after photocuring, by swelling or dissolving the surface portion of the film base material so as to disperse some of the imprint material of the present invention in the film base material. In addition, the solvent also plays a role of a varnish homogenization aid for forming the imprint material of the present invention containing the component (D), which is a poorly soluble or poorly compatible silicone compound described below, into homogeneous varnish.

Therefore, the solvent is a solvent that can provide sufficient adhesion to film base materials listed below, particularly preferable examples of which include triacetyl cellulose, poly(ethylene terephthalate), poly(methylmethacrylate) and cycloolefin (co)polymers, that is, a solvent that can swell the outermost surface portions of film base materials or dissolve the outermost surface portions of film base materials, but does not dissolve the entire film base materials. In addition, the solvent is not particularly limited as long as, particularly, the solvent can improve the compatibility of the silicone compound, and examples thereof include acetone, methyl ethyl ketone, methyl isopropyl ketone, diethyl ketone, methyl isobutyl ketone, methyl n-butyl ketone, cyclohexanone, ethyl acetate, diacetone alcohol, furfuryl alcohol, tetrahydrofurfuryl alcohol and propylene glycol monomethyl ether, and particularly preferable examples thereof include methyl ethyl ketone, methyl isobutyl ketone, ethyl acetate, cyclohexanone and propylene glycol monomethyl ether. The solvent can be used solely or in combination of two or more.

Examples of particularly preferable combinations of the film base material and the solvent which can be preferably used include: a combination with methyl ethyl ketone, cyclohexanone or ethyl acetate when the film base material is triacetyl cellulose; a combination with methyl ethyl ketone, cyclohexanone or ethyl acetate when the film base material is poly(ethylene terephthalate); a combination with methyl ethyl ketone, methyl isopropyl ketone, diethyl ketone, methyl isobutyl ketone, methyl n-butyl ketone, cyclohexanone, ethyl acetate, diacetone alcohol, furfuryl alcohol, tetrahydrofurfuryl alcohol or propylene glycol monomethyl ether when the film base material is methyl polymethacrylate; and a combination with acetone, methyl ethyl ketone, cyclohexanone or ethyl acetate when the film base material is cycloolefin.

In addition, as described below, if a large amount of the solvent remains in coating films (imprint material) when photo-imprint is carried out using the imprint material of the present invention, the solvent may hinder photocuring during the radiation of light, and therefore a drying step in which the films are baked is preferably carried out at a temperature of, for example, 40° C. to 200° C.

Therefore, the solvent which is vaporized in the atmosphere (760 mmHg) at a temperature of 200° C. or lower, particularly preferably, 150° C. or lower, and develops sufficient adhesion is preferably methyl ethyl ketone (boiling point: 79.5° C.), methyl isobutyl ketone (boiling point: 116.2° C.), ethyl acetate (boiling point: 77.1° C.), cyclohexanone (boiling point: 155.6° C.) or propylene glycol monomethyl ether (boiling point: 121.0° C.), and methyl ethyl ketone can be particularly preferably used from the viewpoint of favorable adhesion to film base materials, favorable solubility when forming the imprint material into varnish, and favorable compatibility with other components when varnish is formed.

In addition to the solvent that swells or dissolves the surface portion of a film base material, which is the component (C), other solvents can also be used in combination. Examples of the other solvents include toluene, p-xylylene, o-xylylene, ethylene glycol dimethyl ether, ethylene glycol monomethyl ether, propylene glycol monoethyl ether, ethylene glycol monoethyl ether, ethylene glycol monoisopropyl ether, ethylene glycol methyl ether acetate, propylene glycol monomethyl ether acetate, ethylene glycol ethyl ether acetate, diethylene glycol dimethyl ether, propylene glycol monobutyl ether, ethylene glycol monobutyl ether, diethylene glycol diethyl ether, dipropylene glycol monomethyl ether, diethylene glycol monomethyl ether, dipropylene glycol monoethyl ether, diethylene glycol monoethyl ether, triethylene glycol dimethyl ether, diethylene glycol monoethyl ether acetate, diethylene glycol, 1-octanol, ethylene glycol, hexylene glycol, propylene glycol, benzyl alcohol, 1,3-butanediol, 1,4-butanediol, 2,3-butanediol, 2-heptanone, isopropyl acetate, n-propyl acetate, isobutyl acetate, n-butyl acetate, ethyl lactate, methanol, ethanol, isopropanol, tert-butanol, allyl-alcohol, n-propanol, 2-methyl-2-butanol, isobutanol, n-butanol, 2-methyl-1-butanol, 1-pentanol, 2-methyl-1-pentanol, 2-ethyl hexanol, trimethylene glycol, 1-methoxy-2-butanol and 1,4-dioxane, and the other solvents are not particularly limited as long as the solvents can adjust the viscosity of the component (A).

When other solvents are combined, examples of the combinations of the solvent of the component (C) and the other solvents include a combination of methyl ethyl ketone and isopropanol, a combination of ethyl acetate and isopropanol, a combination of methyl ethyl ketone, methyl isobutyl ketone and isopropanol, and a combination of ethyl acetate and propylene glycol monomethyl ether.

The content of the component (C) in the imprint material of the present invention depends on the thickness of the film base material, the drying temperature after being applied on the film base material, and the drying time; however, the content is not particularly limited as long as the intended effects of the present invention are not impaired, particularly, as long as the component ensures adhesion to the film base material while not excessively dissolving the film base material, and an effect of increasing the compatibilities of the respective components is not impaired.

Preferably, the solvent is contained in such an amount that the proportion of a solid content defined as all the components of the imprint material of the present invention, that is the component (A), the component (B), the component (D) and other additives described below excluding the solvent of the component (C) becomes 10% by mass to 80% by mass, and more preferably 40% by mass to 70% by mass with respect to the imprint material. When the proportion of the solid content is below 10% by mass, a target film thickness cannot be obtained, and, when the proportion exceeds 80% by mass, there are cases in which it is difficult to ensure adhesion to the film base material.

In addition, when the other solvents described above are jointly used as the solvent, the proportion of the solvent of the component (C) in all the solvent components is 10% by mass to 40% by mass.

<Component (D)>

The silicone compound which is the component (D) is a compound having a silicone skeleton (siloxane skeleton) in the molecule, particularly preferably has a dimethyl silicone skeleton, and examples thereof include polyether-modified polydimethyl siloxane.

The silicone compound of the component (D) bleeds out on the outermost surface of a coating film (cured film) when the imprint material of the present invention is applied on a film base material, when dried after being applied, and when exposed to light, so as to decrease the mold release force at the time of detaching the cured film on the film base material from the mold.

Examples of the silicone compound include X-22-164, X-22-164AS, X-22-164A, X-22-164B, X-22-164C, X-22-164E, X-22-163, KF-105, X-22-163A, X-22-163B, X-22-163C, X-22-169AS, X-22-174DX, X-22-1602, X-22-2404, X-22-2426, X-22-9002, X-22-2475, X-22-4952, KF-643, X-22-343, X-22-2046, X-24-8201, FL100-100cs, FL100-450cs (all manufactured by Shin-Etsu Chemical Co., Ltd.), and BYK-302, BYK-307, BYK-322, BYK-323, BYK-330, BYK-333, BYK-370, BYK-375, BYK-378, BYK-UV 3500 and BYK-UV 3570 (all manufactured by BYK Japan KK).

The compound having the silicone skeleton can be used solely or in combination of two or more.

The content of the component (D) in the imprint material of the present invention is preferably 0.01 phr to 5 phr, and more preferably 0.1 phr to 3 phr with respect to the mass of the component (A). When the proportion is below 0.01 phr, it is not possible to sufficiently decrease the mold release force, and, when the proportion exceeds 5 phr, there are cases in which the compatibility in the imprint material in a varnish form deteriorates. Here, phr is the mass of the component (D) (silicone compound) with respect to 100 g of the mass of the component (A).

<Component (E)>

To the imprint material of the present invention, (meth)acrylate and/or urethane (meth)acrylate which contains at least two polymerizable groups, but does not contain an alkylene oxide unit having carbon atom number of 2, 3 or 4 in the molecule may be added as the component (E). The component (E) adjusts the hardness of a cured film obtained through photo-imprint.

Examples of the polymerizable group include an acryloyloxy group, a methacryloyloxy group, a vinyl group and an allyl group. Note that, in the present specification, (meth) acrylates refer to both acrylates and methacrylates. For example, (meth)acrylic acids refer to acrylic acids and methacrylic acids.

Examples of the compound which is the component (E) include 1,3-butanediol dimethacrylate, 1,4-butanediol di(meth)acrylate, 1,6-hexanediol di(meth)acrylate, 1,9-nonanediol di(meth)acrylate, 1,10-decanediol diacrylate, 2-methyl-1,8-octanediol dimethacrylate, tricyclodecane dimethylol di(meth)acrylate, neopentyl glycol di(meth)acrylate, 2-hydroxy-3-acryloyloxy propyl(meth)acrylate, bis(acryloyloxy ethyl)hydroxyl ethyl isocyanurate, glycerine dimethacrylate, pentaerythritol tri(meth)acrylate, trimethylolpropane tri(meth)acrylate, pentaerythritol tetra(meth)acrylate, ditrimethylolpropane tetra(meth)acrylate, dipentaerythritol hexa(meth)acrylate, dipentaerythritol penta(meth)acrylate, dipentaerythritol polyacrylate, pentaerythritol triacrylate hexamethylene diisocyanate urethane prepolymers, pentaerythritol triacrylate toluene diisocyanate urethane prepolymers, pentaerythritol triacrylate isophorone diisocyanate urethane prepolymers and dipentaerythritol pentaacrylate hexamethylene diisocyanate urethane prepolymers.

The above compound is commercially available, and specific examples thereof include NK ESTER 701A, NK ESTER A-DCP, NK ESTER A-DON-N, NK ESTER A-HD-N, NK ESTER A-NOD-N, NK ESTER DCP, NK ESTER DOD-N, NK ESTER HD-N, NK ESTER NOD-N, NK ESTER NPG, NK ESTER A-TMM-3, NK ESTER A-TMM-3L, NK ESTER A-TMM-3LMN, NK ESTER A-TMPT, NK ESTER TMPT, NK ESTER A-TMMT, NK ESTER AD-TMP, NK ESTER A-DPH, NK ESTER A-9550, NK ESTER A-9530, NK ESTER ADP-51EH, NK ESTER ATM-31EH, UA-7100 (all manufactured by Shin-Nakamura Chemical Co., Ltd.), KAYARAD (registered trademark) T-1420, KAYARAD D-330, KAYARAD D-320, KAYARAD D-310, KAYARAD DPCA-20, KAYARAD DPCA-30, KAYARAD DPCA-60, KAYARAD DPCA-120, KAYARAD TMPTA, KAYARAD PET-30, KAYARAD DPHA, KAYARAD DPHA-2C (all manufactured by Nippon Kayaku Co., Ltd.), and UA-306H, UA-306T, UA-3061 and UA-510H (all manufactured by Kyoeisha Chemical Co., Ltd.).

The compound of the component (E) can be used solely or in combination of two or more. When the compound of the component (E) is used, the proportion is preferably 1 phr to 100 phr, and more preferably 1 phr to 70 phr with respect to the mass of the component (A). When more than 100 phr of the component (E) with respect to the component (A) is added, there are cases in which the film hardness excessively increases so that the mold release force increases.

<Other Additives>

The imprint material of the present invention can contain an epoxy compound, a photo acid generator, a photosensitizer, an ultraviolet absorbent, an antioxidant, an adhesion aid or a mold release property improver as necessary, as long as the effects of the present invention are not impaired.

Examples of the epoxy compound include EPOLEAD (registered trademark) GT-401, EPOLEAD PB-3600, CELLOXIDE (registered trademark) 2021P, CELLOXIDE 2000, CELLOXIDE 3000, EHPE 3150, CELLOXIDE EHPE 3150CE, CYCLOMER (registered trademark) M100 (all manufactured by Daicel Corporation), EPICLON (registered trademark) 840, EPICLON 840-S, EPICLON N-660 and EPICLON N-673-80M (all manufactured by DIC Corporation).

Examples of the photo acid generator include IRGACURE (registered trademark) PAG 103, IRGACURE PAG 108, IRGACURE PAG 121, IRGACURE PAG 203, IRGACURE CGI 725 (all manufactured by BASF Japan Ltd.), WPAG-145, WPAG-170, WPAG-199, WPAG-281, WPAG-336, WPAG-367 (all manufactured by Wako Pure Chemical Industries, Ltd.), and TFE TRIAZINE, TME-TRIAZINE, MP-TRIAZINE, dimethoxytriazine, TS-91 and TS-01 (manufactured by Sanwa Chemical Co., Ltd.).

Examples of the photosensitizer include thioxanthene-based photosensitizers, xanthene-based photosensitizers, ketone-based photosensitizers, thiopyrylium salt-based photosensitizers, base styryl-based photosensitizers, merocyanine-based photosensitizers, 3-substituted coumarin-based photosensitizers, 3,4-substituted coumarin-based photosensitizers, cyanine-based photosensitizers, acridine-based photosensitizers, thiazine-based photosensitizers, phenothiazine-based photosensitizers, anthracene-based photosensitizers, coronene-based photosensitizers, benzanthracene-based photosensitizers, perylene-based photosensitizers, ketocoumarin-based photosensitizers, coumarin-based photosensitizers and borate-based photosensitizers.

The photosensitizer can be used solely or in combination of two or more. When the photosensitizer is used, it is also possible to adjust the absorption wavelengths in the UV range.

Examples of the ultraviolet absorbent include TINUVIN (registered trademark) PS, TINUVIN 99-2, TINUVIN 109, TINUVIN 328, TINUVIN 384-2, TINUVIN 400, TINUVIN 405, TINUVIN 460, TINUVIN 477, TINUVIN 479, TINUVIN 900, TINUVIN 928, TINUVIN 1130, TINUVIN 111FDL, TINUVIN 123, TINUVIN 144, TINUVIN 152, TINUVIN 292, TINUVIN 5100, TINUVIN 400-DW, TINUVIN 477-DW, TINUVIN 99-DW, TINUVIN 123-DW, TINUVIN 5050, TINUVIN 5060 and TINUVIN 5151 (manufactured by BASF Japan Ltd.).

The ultraviolet absorbent can be used solely or in combination of two or more. When the ultraviolet absorbent is used, there are cases in which it is possible to suppress the curing rate of the outermost surface of the film during photocuring and to decrease the mold release force.

Examples of the antioxidant include IRGANOX (registered trademark) 1010, IRGANOX 1035, IRGANOX 1076, IRGANOX 1135 and IRGANOX 1520L (manufactured by BASF Japan Ltd.).

The antioxidant can be used solely or in combination of two or more. When the antioxidant is used, it is possible to prevent films from being discolored to yellow due to oxidation.

Examples of the adhesion aid include 3-methacryloxypropyl trimethoxysilane, 3-acryloxypropyltrimethoxysilane and the like. When the adhesion aid is used, the adhesion to the base material improves. The content of the adhesion aid is preferably 5 phr to 50 phr, and more preferably 10 phr to 50 phr with respect to the mass of the component (A).

<Preparation of the Imprint Material>

The method for preparing the imprint material of the present invention is not particularly limited, and any method may be used as long as the component (A), the component (B), the component (C), the component (D), the component (E) which is an optional component, and other additives, if desired, are mixed, and the imprint material is in a homogeneous state.

In addition, the order of mixing the components (A) to (E) and other additives, if desired, does not matter and is not particularly limited as long as homogeneous imprint materials can be obtained. Examples of the preparation method include a method in which the component (A) and the component (B) are mixed at a predetermined proportion. In addition, examples of the preparation method also include a method in which the component (C), the component (D) and the component (E) are mixed with the above mixture to produce a homogeneous imprint material. Furthermore, examples of the preparation method include a method in which, in an appropriate step of the above preparation method, other additives are further added and mixed in as necessary.

In addition, the components may be heated as necessary in order to obtain a homogeneous solution within a short period of time. The heating temperature is not particularly limited as long as the imprint material does not deteriorate or decompose at the temperature, and the components can be heated in a range of 30° C. to 120° C. in terms of the internal temperature of the imprint material.

<Photo-Imprint and Pattern-Transferred Films>

A photo-imprint process in which the imprint material is used includes the following steps a) to e):

a) a step of applying the imprint material of the present invention on a film base material, thereby obtaining a coating film, b) a step of drying the coating film, c) a step of pressing a mold against the dried coating film, in which the coating film is heated as necessary, d) a step of radiating light that cures the coating film with the coating film in contact with the mold, thereby forming a cured film, and e) a step of detaching the formed cured film from the mold.

As described above, a desired film (cured film) can be obtained by applying the imprint material of the present invention on a film base material and photocuring. A well-known method can be used as the coating method, and examples thereof include a spin coating method, a dipping method, a flow coating method, an ink jet method, a spraying method, a bar coating method, a gravure coating method, a slit coating method, a roll coating method, a transfer printing method, brush coating, a blade coating method and an air knife coating method.

The base material for applying the imprint material of the present invention may be a film base material. The film base material refers to flexible and plastic macromolecules which can be deformed by any given force, and is also termed a film substrate, a flexible base material (substrate) or a flexible print base material (substrate).

Examples of the film base material include triacetyl cellulose, poly(ethylene terephthalate), methyl polymethacrylate, cycloolefin (co)polymers, polyvinyl alcohols, polycarbonate, polystyrene, polyimide, polyamide, polyolefin, polypropylene, polyethylene, polyethylene naphthalate, polyether sulfone and copolymers obtained by combining the above polymers.

Among the above, examples of the preferable film base material in the present invention include triacetyl cellulose, poly(ethylene terephthalate), methyl methacrylate and cycloolefin (co)polymers.

The photo-imprint in which the imprint material of the present invention is used essentially includes a drying step of removing the solvent of the component (C) which is an essential component for developing sufficient adhesion to the film base material contained in the material. This is because, if a large amount of the solvent remains in the coating film (imprint material), the remaining solvent may hinder photocuring during light radiation.

The drying step is carried out by baking the coating film before light radiation for the purpose of vaporizing the solvent, and the drying step (baking) may be further carried out on the film (cured film) after light radiation.

The baking device is not particularly limited as long as the coating film can be baked in an appropriate atmosphere, that is, in the atmosphere, in an inert gas, such as nitrogen, or in a vacuum using, for example, a hot plate, an oven or a furnace.

The baking temperature is not particularly limited for the purpose of vaporizing the solvent; however, since the film base material is configured of plastic macromolecules, and dissolves or deforms at a baking temperature of 200° C. or higher so that a target pattern cannot be obtained, it is desirable to set the upper limit of the baking temperature to 200° C. or lower, and particularly preferably 150° C. or lower. Therefore, the baking temperature is, for example, preferably 40° C. to 200° C., and particularly preferably 60° C. to 150° C.

In addition, since the baking time has a direct influence on the takt time in which products are obtained, the baking time is preferably short, and is preferably selected from a range of 10 seconds to 300 seconds, and more preferably selected from a range of 10 seconds to 180 seconds.

The light source that cures the imprint material of the present invention is not particularly limited, and examples thereof include a high-pressure mercury lamp, a low-pressure mercury lamp, an electrodeless lamp, a metal halide lamp, a KrF excimer laser, an ArF excimer laser, an $F_2$ excimer laser, an electron beam (EB) and extreme ultraviolet (EUV) rays. In addition, regarding the wavelength, in general, a G ray of 436 nm, an H ray of 405 nm, an I ray of 365 nm and GHI mixed rays can be used. Furthermore, the exposure amount is preferably 30 mJ/cm$^2$ to 2000 mJ/cm$^2$, and more preferably 30 mJ/cm$^2$ to 1000 mJ/cm$^2$.

The apparatus that carries out the photo-imprint is not particularly limited as long as the target pattern can be obtained. For example, commercially available apparatuses such as ST50 manufactured by Toshiba Machine Co., Ltd., Sindre (registered trademark) 60 manufactured by Obducat AB and NM-0801HB manufactured by Meisyo Kiko, and a method in which the base material and the mold are pressed against each other using rollers and the base material is released from the mold after photocuring can be used.

In addition, examples of a mold material used for photo-imprint used in the present invention include silica, silicon, nickel, alumina, carbonylsilane and glassy carbon, and the mold material is not particularly limited as long as the target pattern can be obtained. In addition, a mold release treatment in which a thin film of a fluorine-based compound or the like is formed may be carried out on the surface of the mold in order to enhance the mold release property. Examples of a mold release agent used in the mold release treatment include OPTOOL (registered trademark) HD and OPTOOL DSX manufactured by Daikin Industries, Ltd., and the mold release agent is not particularly limited as long as the target pattern can be obtained.

The pattern size of the photo-imprint is on a nanometer order, and specifically follows a pattern size of less than 1 micron.

The adhesion between a cured film obtained when the imprint material of the present invention is applied on the film base material and photocured and the film base material is preferably 100/100 in the imprint material of the present invention when evaluated in a test in accordance with JIS K5400.

The above adhesion test is also called a cross-cut adhesion test, and evaluates the resistance of a film to peel-off from the base when the film is cut (damaged) in a grid-shaped right angle lattice pattern (e.g. 100 cells) and the cut reaches to the base (substrate). The adhesion of 100/100 indicates a result that all 100 cells of the 100 cells have not peeled off.

Note that, in the present invention, a 90° detachment test for evaluating the mold release force refers to a test in which, generally, an adhering body (equivalent to a cured film formed of the imprint material in the present invention) is attached to an adhered body (equivalent to the film base material in the present invention), and, after a predetermined period of time elapses, a resistance (tension) generated when the adhering body is peeled off at a predetermined peeling speed in a 90° direction is measured. The measurement is usually carried out using an evaluation method with reference to JIS Z0237. A value obtained by converting the measured resistance into a resistance per width of the adhered body can be evaluated as the mold release force.

In addition, the mold release force measured in a test in which the imprint material of the present invention is applied on the film base material, the coating film on the film base material is brought into contact with a surface of a mold, which has a pattern shape, subsequently, the coating film is photocured while being in contact with the surface of the mold, which has a pattern shape, and then a cured film on the film base material is detached at 90° from the surface of the mold which has a pattern shape, that is, a value obtained by converting a load when the cured film on the film base material is fully detached from the surface of the mold, which has a pattern shape, into a load per 1 cm of a lateral width of the film base material, is preferably larger than 0 g/cm to 0.5 g/cm or less, and more preferably 0.4 g/cm or less.

In the present invention, the mold release force defined as described above is a quantified value (g/cm) of a force generated when a film including a photocured film is detached from a mold, unlike the evaluation of mold release property such as the microscopic observation of the pattern transfer rates of mold shapes, which has hitherto been reported. In addition, the force generated when a film is actually detached increases as the mold width and the film width increase.

In the roll-to-roll processing handled in the photo nanoimprint lithography field, the mold and the film width are generally long. Therefore, there is a tendency of a force that separates a mold and a film increasing, and thus there is a concern of attachment of the film (resin) to the mold and the consequent deterioration of the mold. Therefore, it is considered that a decrease in the load per unit length (the mold release force in the present invention) extends the durability of the mold and can stably supply films, that is, a decrease in the mold release force is one of the important performances in the imprint material.

Films which are manufactured using the imprint material of the present invention and to which a pattern is transferred as described above, semiconductor elements including the film, optical members, solid-state imaging devices, LED devices, solar cells, displays and electronic devices each including the film on a base material thereof, are also the subjects of the present invention.

EXAMPLES

Hereinafter, the present invention will be described in more detail using Examples and Comparative Examples, but the present invention is not limited to Examples.

The following measurement apparatuses were used in Examples.

[Exposure Apparatus]
Apparatus: electrodeless uniform radiation apparatus QRE-4016A manufactured by Orc Manufacturing Co., Ltd.
[Ultraviolet/Visible Spectrophotometer]
Apparatus: SHIMADSU UV-3600 manufactured by Shimadzu Corporation
[Adhesion Test]
Standard: JIS K5400
[Full Automatic Film Applicator]
Apparatus: KT-AB3120 manufactured by COTEC
[Mold Release Treatment]
A moth-eye patterned nickel mold (manufactured by InnoX Co., Ltd.) with a pitch of 250 nm and a height of 250 nm and a silicon substrate which is used in a photocurability test described below were immersed in a solution obtained by diluting OPTOOL (registered trademark) DSX (manufactured by Daikin Industries, Ltd.) in NOVEC (registered trademark) HFE-7100 (hydrofluoroether, manufactured by Sumitomo 3M Limited) to 0.1% by mass (hereinafter referred to simply as "NOVEC HFE-7100"), treated for 1 hour using a high-temperature and high-humidity apparatus with a temperature of 90° C. and a humidity of 90 RH %, rinsed using NOVEC HFE-7100, and then air-dried.

[Preparation of Imprint Materials]

Example 1

Into a 50 mL one-neck recovery flask, 10.00 g of A-200 (manufactured by Shin-Nakamura Chemical Co., Ltd.) was weighed, and subsequently, 0.25 g (2.5 phr with respect to the mass of A-200) of Lucirin TPO (registered trademark) (manufactured by BASF Japan Ltd. (hereinafter referred to simply as "TPO" in the specification), 0.05 g (0.5 phr with respect to the mass of A-200) of BYK-333 (manufactured by BYK Japan KK) and 10.30 g of methyl ethyl ketone (hereinafter referred to simply as "MEK" in the specification) were added. The whole was stirred using a magnetic stirrer, thereby preparing an imprint material A1 (an MEK solution with a solid content of 50%) in a transparent and homogeneous varnish form.

Example 2

An imprint material A2 (an MEK solution with a solid content of 50%) was prepared in the same manner as in Example 1 except that A-200 in Example 1 was changed to A-400 (manufactured by Shin-Nakamura Chemical Co., Ltd.).

Example 3

An imprint material A3 (an MEK solution with a solid content of 50%) was prepared in the same manner as in Example 1 except that A-200 in Example 1 was changed to A-600 (manufactured by Shin-Nakamura Chemical Co., Ltd.).

Example 4

An imprint material A4 (an MEK solution with a solid content of 50%) was prepared in the same manner as in Example 1 except that A-200 in Example 1 was changed to A-1000 (manufactured by Shin-Nakamura Chemical Co., Ltd.).

Example 5

An imprint material A5 (an MEK solution with a solid content of 50%) was prepared in the same manner as in Example 1 except that A-200 in Example 1 was changed to KAYARAD (registered trademark) DPEA-12 (manufactured by Nippon Kayaku Co., Ltd.).

Example 6

An imprint material A6 (an MEK solution with a solid content of 50%) was prepared in the same manner as in Example 1 except that A-200 in Example 1 was changed to 1G (manufactured by Shin-Nakamura Chemical Co., Ltd.).

Example 7

An imprint material A7 (an MEK solution with a solid content of 50%) was prepared in the same manner as in Example 1 except that A-200 in Example 1 was changed to APG-100 (manufactured by Shin-Nakamura Chemical Co., Ltd.).

Example 8

An imprint material A8 (an MEK solution with a solid content of 50%) was prepared in the same manner as in Example 1 except that A-200 in Example 1 was changed to APG-200 (manufactured by Shin-Nakamura Chemical Co., Ltd.).

Example 9

An imprint material A9 (an MEK solution with a solid content of 50%) was prepared in the same manner as in Example 1 except that A-200 in Example 1 was changed to APG-400 (manufactured by Shin-Nakamura Chemical Co., Ltd.).

Example 10

An imprint material A10 (an MEK solution with a solid content of 50%) was prepared in the same manner as in Example 1 except that A-200 in Example 1 was changed to APG-700 (manufactured by Shin-Nakamura Chemical Co., Ltd.).

Example 11

An imprint material A11 (an MEK solution with a solid content of 50%) was prepared in the same manner as in Example 1 except that A-200 in Example 1 was changed to A-PTMG-65 (manufactured by Shin-Nakamura Chemical Co., Ltd.).

Example 12

Into a 50 mL one-neck recovery flask, 5.00 g of A-1000 (manufactured by Shin-Nakamura Chemical Co., Ltd.) and 5.00 g of KAYARAD (registered trademark) DPEA-12 (manufactured by Nippon Kayaku Co., Ltd.) were weighed, and subsequently, 0.25 g (2.5 phr with respect to the total mass of A-1000 and DPEA-12) of TPO and 0.05 g (0.5 phr with respect to the total mass of A-1000 and DPEA-12) of BYK-333 (manufactured by BYK Japan KK) and 10.30 g of MEK were added. The whole was stirred using a magnetic stirrer, thereby preparing an imprint material A12 (an MEK solution with a solid content of 50%) in a transparent and homogeneous varnish form.

Example 13

An imprint material A13 (an MEK solution with a solid content of 50%) was prepared in the same manner as in Example 12 except that A-1000 in Example 12 was changed to APG-700 (manufactured by Shin-Nakamura Chemical Co., Ltd.).

Example 14

An imprint material A14 (an MEK solution with a solid content of 50%) was prepared in the same manner as in Example 12 except that A-1000 in Example 12 was changed to A-PTMG-65 (manufactured by Shin-Nakamura Chemical Co., Ltd.).

Example 15

An imprint material A15 (an MEK solution with a solid content of 50%) was prepared in the same manner as in Example 4 except that TPO in Example 4 was changed to IRGACURE 184 (manufactured by BASF Japan Ltd. (hereinafter referred to simply as "184" in the specification)).

Example 16

An imprint material A16 (an MEK solution with a solid content of 50%) was prepared in the same manner as in Example 5 except that TPO in Example 5 was changed to 184.

Example 17

An imprint material A17 (an MEK solution with a solid content of 50%) was prepared in the same manner as in Example 12 except that TPO in Example 12 was changed to 184.

Example 18

An imprint material A18 (an MEK solution with a solid content of 50%) was prepared in the same manner except that TPO in Example 12 was changed to DAROCURE 1173 (manufactured by BASF Japan Ltd. (hereinafter referred to simply as "1173" in the specification)).

Example 19

An imprint material A19 (an MIBK solution with a solid content of 50%) was prepared in the same manner as in Example 5 except that MEK in Example 5 was changed to methyl isobutyl ketone (hereinafter referred to simply as "MIBK" in the specification).

Example 20

An imprint material A20 (an EtOAc solution with a solid content of 50%) was prepared in the same manner as in Example 5 except that MEK in Example 5 was changed to ethyl acetate (hereinafter referred to simply as "EtOAc" in the specification).

Example 21

An imprint material A21 (a CHN solution with a solid content of 50%) was prepared in the same manner as in Example 5 except that MEK in Example 5 was changed to cyclohexanone (hereinafter referred to simply as "CHN" in the specification).

Example 22

An imprint material A22 (a PGME solution with a solid content of 50%) was prepared in the same manner as in Example 5 except that MEK in Example 5 was changed to propylene glycol monomethyl ether (hereinafter referred to simply as "PGME" in the specification).

Example 23

An imprint material A23 (an MEK solution with a solid content of 50%) was prepared in the same manner as in Example 12 except that BYK-333 in Example 12 was changed to BYK-307 (manufactured by BYK Japan KK).

Example 24

An imprint material A24 (an MEK solution with a solid content of 50%) was prepared in the same manner as in Example 12 except that BYK-333 in Example 12 was changed to X-22-164AS (manufactured by Shin-Etsu Chemical Co., Ltd.).

Example 25

An imprint material A25 (an MEK solution with a solid content of 50%) was prepared in the same manner as in Example 12 except that BYK-333 in Example 12 was changed to X-22-164E (manufactured by Shin-Etsu Chemical Co., Ltd.).

Example 26

An imprint material A26 (an MEK solution with a solid content of 50%) was prepared in the same manner as in Example 12 except that BYK-333 in Example 12 was changed to X-22-1602 (manufactured by Shin-Etsu Chemical Co., Ltd.).

Example 27

An imprint material A27 (an MEK solution with a solid content of 50%) was prepared in the same manner as in Example 12 except that BYK-333 in Example 12 was changed to X-22-2426 (manufactured by Shin-Etsu Chemical Co., Ltd.).

Example 28

An imprint material A28 (an MEK solution with a solid content of 50%) was prepared in the same manner as in Example 12 except that BYK-333 in Example 12 was changed to X-22-2404 (manufactured by Shin-Etsu Chemical Co., Ltd.).

Example 29

An imprint material A29 (an MEK solution with a solid content of 50%) was prepared in the same manner as in Example 12 except that BYK-333 in Example 12 was changed to X-24-8201 (manufactured by Shin-Etsu Chemical Co., Ltd.).

Example 30

An imprint material A30 (an MEK solution with a solid content of 50%) was prepared in the same manner as in Example 12 except that BYK-333 in Example 12 was changed to FL100-100cs (manufactured by Shin-Etsu Chemical Co., Ltd.).

Example 31

An imprint material A31 (an MEK solution with a solid content of 50%) was prepared in the same manner as in Example 12 except that BYK-333 in Example 12 was changed to FL100-450cs (manufactured by Shin-Etsu Chemical Co., Ltd.).

Example 32

Into a 50 mL one-neck recovery flask, 5.00 g of A-1000 (manufactured by Shin-Nakamura Chemical Co., Ltd.) and 5.00 g of KAYARAD (registered trademark) DPEA-12 (manufactured by Nippon Kayaku Co., Ltd.) were weighed, and subsequently, 0.25 g (2.5 phr with respect to the total mass of A-1000 and DPEA-12) of TPO, 0.05 g (0.5 phr with respect to the total mass of A-1000 and DPEA-12) of BYK-333 (manufactured by BYK Japan KK), 1.00 g (10 phr with respect to the total mass of A-1000 and DPEA-12) of KAYARAD (registered trademark) DPHA (manufactured by Nippon Kayaku Co., Ltd.) and 11.30 g of MEK were added. The whole was stirred using a magnetic stirrer, thereby preparing an imprint material A32 (an MEK solution with a solid content of 50%) in a transparent and homogeneous varnish form.

Example 33

An imprint material A33 (an MEK solution with a solid content of 50%) was prepared in the same manner as in Example 32 except that DPHA in Example 32 was changed to KAYARAD (registered trademark) PET-30 (manufactured by Nippon Kayaku Co., Ltd.).

Example 34

An imprint material A34 (an MEK solution with a solid content of 50%) was prepared in the same manner as in Example 32 except that DPHA in Example 32 was changed to A-DCP (manufactured by Shin-Nakamura Chemical Co., Ltd.).

Example 35

An imprint material A35 (an MEK solution with a solid content of 50%) was prepared in the same manner as in Example 32 except that DPHA in Example 32 was changed to UA-306H (manufactured by Kyoeisha Chemical Co., Ltd.).

Example 36

An imprint material A36 (an MEK solution with a solid content of 50%) was prepared in the same manner as in Example 32 except that DPHA in Example 32 was changed to UA-7100 (manufactured by Shin-Nakamura Chemical Co., Ltd.).

Example 37

Into a 50 mL one-neck recovery flask, 4.00 g of A-200 (manufactured by Shin-Nakamura Chemical Co., Ltd.) was weighed, and subsequently, 0.10 g (2.5 phr with respect to the mass of A-200) of TPO, 0.02 g (0.5 phr with respect to the mass of A-200) of BYK-333 (manufactured by BYK Japan KK), and 16.48 g of MEK were added. The whole was stirred using a magnetic stirrer, thereby preparing an imprint material A37 (an MEK solution with a solid content of 20%) in a transparent and homogeneous varnish form.

Example 38

Into a 50 mL one-neck recovery flask, 14.00 g of A-200 (manufactured by Shin-Nakamura Chemical Co., Ltd.) was weighed, and subsequently, 0.35 g (2.5 phr with respect to the mass of A-200) of TPO, 0.07 g (0.5 phr with respect to the mass of A-200) of BYK-333 (manufactured by BYK Japan KK), and 6.18 g of MEK were added. The whole was stirred using a magnetic stirrer, thereby preparing an imprint material A38 (an MEK solution with a solid content of 70%) in a transparent and homogeneous varnish form.

Example 39

An imprint material A39 (an MEK solution with a solid content of 50%) was prepared in the same manner as in Example 1 except that BYK-333 in Example 1 was changed to BYK-307 (manufactured by BYK Japan KK).

Example 40

An imprint material A40 (an MEK solution with a solid content of 50%) was prepared in the same manner as in Example 1 except that BYK-333 in Example 1 was changed to X-22-164AS (manufactured by Shin-Etsu Chemical Co., Ltd.).

Example 41

An imprint material A41 (an MEK solution with a solid content of 50%) was prepared in the same manner as in Example 1 except that BYK-333 in Example 1 was changed to X-22-164E (manufactured by Shin-Etsu Chemical Co., Ltd.).

Example 42

An imprint material A42 (an MEK solution with a solid content of 50%) was prepared in the same manner as in Example 1 except that BYK-333 in Example 1 was changed to X-22-1602 (manufactured by Shin-Etsu Chemical Co., Ltd.).

Example 43

An imprint material A43 (an MEK solution with a solid content of 50%) was prepared in the same manner as in Example 1 except that BYK-333 in Example 1 was changed to X-22-2426 (manufactured by Shin-Etsu Chemical Co., Ltd.).

Example 44

An imprint material A44 (an MEK solution with a solid content of 50%) was prepared in the same manner as in Example 1 except that BYK-333 in Example 1 was changed to X-22-2404 (manufactured by Shin-Etsu Chemical Co., Ltd.).

Example 45

An imprint material A45 (an MEK solution with a solid content of 50%) was prepared in the same manner as in Example 1 except that BYK-333 in Example 1 was changed to X-24-8201 (manufactured by Shin-Etsu Chemical Co., Ltd.).

Example 46

An imprint material A46 (an MEK solution with a solid content of 50%) was prepared in the same manner as in Example 1 except that BYK-333 in Example 1 was changed to FL100-100cs (manufactured by Shin-Etsu Chemical Co., Ltd.).

Example 47

An imprint material A47 (an MEK solution with a solid content of 50%) was prepared in the same manner as in Example 1 except that BYK-333 in Example 1 was changed to FL100-450cs (manufactured by Shin-Etsu Chemical Co., Ltd.).

Comparative Example 1

Into a 50 mL one-neck recovery flask, 10.00 g of A-200 (manufactured by Shin-Nakamura Chemical Co., Ltd.) was weighed, and subsequently, 0.05 g (0.5 phr with respect to the mass of A-200) of BYK-333 (manufactured by BYK Japan KK) and 10.05 g of MEK were added. The whole was stirred using a magnetic stirrer, thereby preparing an imprint material B1 in a transparent and homogeneous varnish form.

Comparative Example 2

An imprint material B2 was prepared in the same manner as in Comparative Example 1 except that A-200 in Comparative Example 1 was changed to A-400 (manufactured by Shin-Nakamura Chemical Co., Ltd.).

Comparative Example 3

An imprint material B3 was prepared in the same manner as in Comparative Example 1 except that A-200 in Comparative Example 1 was changed to A-600 (manufactured by Shin-Nakamura Chemical Co., Ltd.).

Comparative Example 4

An imprint material B4 was prepared in the same manner as in Comparative Example 1 except that A-200 in Comparative Example 1 was changed to A-1000 (manufactured by Shin-Nakamura Chemical Co., Ltd.).

Comparative Example 5

An imprint material B5 was prepared in the same manner as in Comparative Example 1 except that A-200 in Comparative Example 1 was changed to KAYARAD (registered trademark) DPEA-12 (manufactured by Nippon Kayaku Co., Ltd.).

Comparative Example 6

An imprint material B6 was prepared in the same manner as in Comparative Example 1 except that A-200 in Comparative Example 1 was changed to 1G (manufactured by Shin-Nakamura Chemical Co., Ltd.).

Comparative Example 7

An imprint material B7 was prepared in the same manner as in Comparative Example 1 except that A-200 in Comparative Example 1 was changed to APG-100 (manufactured by Shin-Nakamura Chemical Co., Ltd.).

Comparative Example 8

An imprint material B8 was prepared in the same manner as in Comparative Example 1 except that A-200 in Comparative Example 1 was changed to APG-200 (manufactured by Shin-Nakamura Chemical Co., Ltd.).

Comparative Example 9

An imprint material B9 was prepared in the same manner as in Comparative Example 1 except that A-200 in Comparative Example 1 was changed to APG-400 (manufactured by Shin-Nakamura Chemical Co., Ltd.).

Comparative Example 10

An imprint material B10 was prepared in the same manner as in Comparative Example 1 except that A-200 in Comparative Example 1 was changed to APG-700 (manufactured by Shin-Nakamura Chemical Co., Ltd.).

Comparative Example 11

An imprint material B11 was prepared in the same manner as in Comparative Example 1 except that A-200 in Comparative Example 1 was changed to A-PTMG-65 (manufactured by Shin-Nakamura Chemical Co., Ltd.).

Comparative Example 12

Into a 50 mL one-neck recovery flask, 20.00 g of A-200 (manufactured by Shin-Nakamura Chemical Co., Ltd.) was weighed, and subsequently, 0.05 g (2.5 phr with respect to the mass of A-200) of TPO and 0.10 g (0.5 phr with respect to the mass of A-200) of BYK-333 (manufactured by BYK Japan KK) were added. The whole was stirred using a magnetic stirrer, thereby preparing an imprint material B12 in a transparent and homogeneous varnish form.

Comparative Example 13

An imprint material B13 was prepared in the same manner as in Comparative Example 12 except that A-200 in Comparative Example 12 was changed to A-400 (manufactured by Shin-Nakamura Chemical Co., Ltd.).

Comparative Example 14

An imprint material B14 was prepared in the same manner as in Comparative Example 12 except that A-200 in Comparative Example 12 was changed to A-600 (manufactured by Shin-Nakamura Chemical Co., Ltd.).

Comparative Example 15

An imprint material B15 was prepared in the same manner as in Comparative Example 12 except that A-200 in Comparative Example 12 was changed to A-1000 (manufactured by Shin-Nakamura Chemical Co., Ltd.). However, B15 was not obtained in a transparent and homogeneous varnish form.

Comparative Example 16

An imprint material B16 was prepared in the same manner as in Comparative Example 12 except that A-200 in Comparative Example 12 was changed to KAYARAD (registered trademark) DPEA-12 (manufactured by Nippon Kayaku Co., Ltd.).

Comparative Example 17

An imprint material B17 was prepared in the same manner as in Comparative Example 12 except that A-200 in Comparative Example 12 was changed to 1G (manufactured by Shin-Nakamura Chemical Co., Ltd.).

Comparative Example 18

An imprint material B18 was prepared in the same manner as in Comparative Example 12 except that A-200 in Comparative Example 12 was changed to APG-100 (manufactured by Shin-Nakamura Chemical Co., Ltd.).

Comparative Example 19

An imprint material B19 was prepared in the same manner as in Comparative Example 12 except that A-200 in Comparative Example 12 was changed to APG-200 (manufactured by Shin-Nakamura Chemical Co., Ltd.).

Comparative Example 20

An imprint material B20 was prepared in the same manner as in Comparative Example 12 except that A-200 in Comparative Example 12 was changed to APG-400 (manufactured by Shin-Nakamura Chemical Co., Ltd.).

Comparative Example 21

An imprint material B21 was prepared in the same manner as in Comparative Example 12 except that A-200 in Comparative Example 12 was changed to APG-700 (manufactured by Shin-Nakamura Chemical Co., Ltd.).

Comparative Example 22

An imprint material B22 was prepared in the same manner as in Comparative Example 12 except that A-200 in Comparative Example 12 was changed to A-PTMG-65 (manufactured by Shin-Nakamura Chemical Co., Ltd.).

Comparative Example 23

An imprint material B23 was prepared in the same manner as in Comparative Example 12 except that BYK-333 in Comparative Example 12 was changed to BYK-307 (manufactured by BYK Japan KK). However, B23 was not obtained in a transparent and homogeneous varnish form.

Comparative Example 24

An imprint material B24 was prepared in the same manner as in Comparative Example 12 except that BYK-333 in Comparative Example 12 was changed to X-22-164AS (manufactured by Shin-Etsu Chemical Co., Ltd.). However, B24 was not obtained in a transparent and homogeneous varnish form.

Comparative Example 25

An imprint material B25 was prepared in the same manner as in Comparative Example 12 except that BYK-333 in Comparative Example 12 was changed to X-22-164E (manufactured by Shin-Etsu Chemical Co., Ltd.). However, B25 was not obtained in a transparent and homogeneous varnish form.

Comparative Example 26

An imprint material B26 was prepared in the same manner as in Comparative Example 12 except that BYK-333 in Comparative Example 12 was changed to X-22-1602 (manufactured by Shin-Etsu Chemical Co., Ltd.).

Comparative Example 27

An imprint material B27 was prepared in the same manner as in Comparative Example 12 except that BYK-333 in Comparative Example 12 was changed to X-22-2426 (manufactured by Shin-Etsu Chemical Co., Ltd.). However, B27 was not obtained in a transparent and homogeneous varnish form.

Comparative Example 28

An imprint material B28 was prepared in the same manner as in Comparative Example 12 except that BYK-333 in Comparative Example 12 was changed to X-22-2404 (manufactured by Shin-Etsu Chemical Co., Ltd.).

Comparative Example 29

An imprint material B29 was prepared in the same manner as in Comparative Example 12 except that BYK-333 in Comparative Example 12 was changed to X-24-8201 (manufactured by Shin-Etsu Chemical Co., Ltd.). However, B29 was not obtained in a transparent and homogeneous varnish form.

Comparative Example 30

An imprint material B30 was prepared in the same manner as in Comparative Example 12 except that BYK-333 in Comparative Example 12 was changed to FL100-100cs (manufactured by Shin-Etsu Chemical Co., Ltd.).

Comparative Example 31

An imprint material B31 was prepared in the same manner as in Comparative Example 12 except that BYK-333 in Comparative Example 12 was changed to Comparative Example 12 and FL100-450cs (manufactured by Shin-Etsu Chemical Co., Ltd.). However, B31 was not obtained in a transparent and homogeneous varnish form.

Comparative Example 32

Into a 50 mL one-neck recovery flask, 20.00 g of A-200 (manufactured by Shin-Nakamura Chemical Co., Ltd.) was weighed, and subsequently, 0.50 g (2.5 phr with respect to the mass of A-200) of TPO, 0.10 g (0.5 phr with respect to the mass of A-200) of X-22-164E (manufactured by Shin-Etsu Chemical Co., Ltd.) and 2.00 g (10 phr with respect to the mass of A-200) of KAYARAD (registered trademark) DPHA (manufactured by Nippon Kayaku Co., Ltd.) were added. The whole was stirred using a magnetic stirrer, thereby preparing an imprint material B32. However, B32 was not obtained in a transparent and homogeneous varnish form.

Comparative Example 33

An imprint material B33 was prepared in the same manner as in Comparative Example 32 except that X-22-164E and KAYARAD (registered trademark) DPHA in Comparative Example 32 were changed to X-22-2426 (manufactured by Shin-Etsu Chemical Co., Ltd.) and KAYARAD (registered trademark) PET-30 (manufactured by Nippon Kayaku Co., Ltd.), respectively. However, B33 was not obtained in a transparent and homogeneous varnish form.

Comparative Example 34

An imprint material B34 was prepared in the same manner as in Comparative Example 32 except that X-22-164E and KAYARAD (registered trademark) DPHA in Comparative Example 32 were changed to X-24-8201 (manufactured by Shin-Etsu Chemical Co., Ltd.) and A-DCP (manufactured by Shin-Nakamura Chemical Co., Ltd.), respectively. However, B34 was not obtained in a transparent and homogeneous varnish form.

Comparative Example 35

An imprint material B35 was prepared in the same manner as in Comparative Example 32 except that X-22-164E and KAYARAD (registered trademark) DPHA in Comparative Example 32 were changed to FL100-100cs (manufactured by Shin-Etsu Chemical Co., Ltd.) and UA-306H (manufactured by Kyoeisha Chemical Co., Ltd.), respectively. However, B35 was not obtained in a transparent and homogeneous varnish form.

Comparative Example 36

An imprint material B36 was prepared in the same manner as in Comparative Example 32 except that X-22-164E and KAYARAD (registered trademark) DPHA in Comparative Example 32 were changed to FL100-450cs (manufactured by Shin-Etsu Chemical Co., Ltd.) and UA-7100 (manufactured by Shin-Nakamura Chemical Co., Ltd.), respectively. However, B36 was not obtained in a transparent and homogeneous varnish form.

Comparative Example 37

Into a 50 mL one-neck recovery flask, 10.00 g of A-200 (manufactured by Shin-Nakamura Chemical Co., Ltd.) was weighed, and subsequently, 0.25 g (2.5 phr with respect to the mass of A-200) of TPO and 10.25 g of MEK were added. The whole was stirred using a magnetic stirrer, thereby preparing an imprint material B37.

Comparative Example 38

An imprint material B38 was prepared in the same manner as in Comparative Example 37 except that A-200 in Comparative Example 37 was changed to A-400 (manufactured by Shin-Nakamura Chemical Co., Ltd.).

Comparative Example 39

An imprint material B39 was prepared in the same manner as in Comparative Example 37 except that A-200 in Comparative Example 37 was changed to A-600 (manufactured by Shin-Nakamura Chemical Co., Ltd.).

Comparative Example 40

An imprint material B40 was prepared in the same manner as in Comparative Example 37 except that A-200 in Comparative Example 37 was changed to A-1000 (manufactured by Shin-Nakamura Chemical Co., Ltd.).

Comparative Example 41

An imprint material B41 was prepared in the same manner as in Comparative Example 37 except that A-200 in Comparative Example 37 was changed to KAYARAD (registered trademark) DPEA-12 (manufactured by Nippon Kayaku Co., Ltd.).

Comparative Example 42

An imprint material B42 was prepared in the same manner as in Comparative Example 37 except that A-200 in Comparative Example 37 was changed to 1G (manufactured by Shin-Nakamura Chemical Co., Ltd.).

Comparative Example 43

An imprint material B43 was prepared in the same manner as in Comparative Example 37 except that A-200 in Comparative Example 37 was changed to APG-100 (manufactured by Shin-Nakamura Chemical Co., Ltd.).

Comparative Example 44

An imprint material B44 was prepared in the same manner as in Comparative Example 37 except that A-200 in Comparative Example 37 was changed to APG-200 (manufactured by Shin-Nakamura Chemical Co., Ltd.).

Comparative Example 45

An imprint material B45 was prepared in the same manner as in Comparative Example 37 except that A-200 in Comparative Example 37 was changed to APG-400 (manufactured by Shin-Nakamura Chemical Co., Ltd.).

Comparative Example 46

An imprint material B46 was prepared in the same manner as in Comparative Example 37 except that A-200 in Comparative Example 37 was changed to APG-700 (manufactured by Shin-Nakamura Chemical Co., Ltd.).

Comparative Example 47

An imprint material B47 was prepared in the same manner as in Comparative Example 37 except that A-200 in Comparative Example 37 was changed to A-PTMG-65 (manufactured by Shin-Nakamura Chemical Co., Ltd.).

Comparative Example 48

Into a 50 mL one-neck recovery flask, 5.00 g of A-1000 (manufactured by Shin-Nakamura Chemical Co., Ltd.) and 5.00 g of KAYARAD (registered trademark) DPEA-12 (manufactured by Nippon Kayaku Co., Ltd.) were weighed, and subsequently, 0.25 g (2.5 phr with respect to the total mass of A-1000 and DPEA-12) of TPO and 10.25 g of MEK were added. The whole was stirred using a magnetic stirrer, thereby preparing an imprint material A48 in a transparent and homogeneous varnish form.

Comparative Example 49

Into a 50 mL one-neck recovery flask, 10.00 g of KAYARAD (registered trademark) DPHA-12 (manufactured by Nippon Kayaku Co., Ltd.) was weighed, and subsequently, 0.25 g (2.5 phr with respect to the mass of DPHA) of TPO and 10.25 g of MEK were added. The whole was stirred using a magnetic stirrer, thereby preparing an imprint material B49 in a transparent and homogeneous varnish form.

Comparative Example 50

An imprint material B50 was prepared in the same manner as in Comparative Example 49 except that DPHA in Comparative Example 49 was changed to KAYARAD (registered trademark) PET-30 (manufactured by Nippon Kayaku Co., Ltd.).

Comparative Example 51

An imprint material B51 was prepared in the same manner as in Comparative Example 49 except that DPHA in Comparative Example 49 was changed to A-DCP (manufactured by Shin-Nakamura Chemical Co., Ltd.).

Comparative Example 52

An imprint material B52 was prepared in the same manner as in Comparative Example 49 except that DPHA in Comparative Example 49 was changed to UA-306H (manufactured by Kyoeisha Chemical Co., Ltd.).

Comparative Example 53

An imprint material B53 was prepared in the same manner as in Comparative Example 49 except that DPHA in Comparative Example 49 was changed to UA-7100 (manufactured by Shin-Nakamura Chemical Co., Ltd.).

Comparative Example 54

Into a 50 mL, one-neck recovery flask, 18.00 g of A-200 (manufactured by Shin-Nakamura Chemical Co., Ltd.) was weighed, and subsequently, 0.45 g (2.5 phr with respect to the mass of A-200) of TPO, 0.09 g (0.5 phr with respect to the mass of A-200) of BYK-333 (manufactured by BYK Japan KK), and 2.06 g of MEK were added. The whole was stirred using a magnetic stirrer, thereby preparing an imprint material B54 (an MEK solution with a solid content of 90%) in a transparent and homogeneous varnish form.

Comparative Example 55

An imprint material B55 (an MIBK solution with a solid content of 90%) was prepared in the same manner as in Comparative Example 54 except that MEK in Comparative Example 54 was changed to MIBK.

Comparative Example 56

An imprint material B56 (an EtOAc solution with a solid content of 90%) was prepared in the same manner as in Comparative Example 54 except that MEK in Comparative Example 54 was changed to EtOAc.

Comparative Example 57

An imprint material B57 (a CHN solution with a solid content of 90%) was prepared in the same manner as in Comparative Example 54 except that MEK in Comparative Example 54 was changed to CHN.

Comparative Example 58

An imprint material B58 (a PGME solution with a solid content of 90%) was prepared in the same manner as in Comparative Example 54 except that MEK in Comparative Example 54 was changed to PGME.

Comparative Example 59

An imprint material B59 (an IPA solution with a solid content of 50%) was prepared in the same manner as in Example 1 except that MEK in Example 1 was changed to isopropyl alcohol (hereinafter referred to simply as "IPA").

Comparative Example 60

An imprint material B60 (a Tol solution with a solid content of 50%) was prepared in the same manner except that MEK in Example 1 was changed to toluene (hereinafter referred to simply as "Tol").

[Solubility (Compatibility) Test]

In Examples 1 to 47, Comparative Example 15, Comparative Examples 23 to 25, Comparative Example 27, Comparative Example 29 and Comparative Examples 31 to 36, whether the imprint materials had been obtained in a transparent and homogeneous varnish form was visually evaluated in the following manner.

○: the imprint material was in a transparent and homogeneous varnish form

×: the imprint material was in an opaque or inhomogeneous varnish form

Note that the varnish form that is an opaque or inhomogeneous form (which is not a transparent and homogeneous form) specifically refers to a state in which the entire varnish is white-turbid or white foreign substances are floating in the varnish. Materials which fail to be in a transparent and homogeneous varnish form described above cause layer separation as time elapses, and cause variations in the performances of coating films and cured films. As a result, it is not possible to stably supply products, and thus the materials are determined to be inappropriate as imprint materials.

The obtained results and the components (A) to (E) of the imprint materials are shown in Table 1 (Tables 1-1 to 1-3). Note that, in Table 1 (Tables 1-1 to 1-3), cases in which the corresponding component was not added are indicated with "-(hyphen)".

TABLE 1-1

|  | Component (A) | Component (E) | Component (B) | Component (C) | Component (D) | Determination |
|---|---|---|---|---|---|---|
| Example 1 | A-200 | — | TPO | MEK 50% | BYK-333 | ○ |
| Example 2 | A-400 | — | TPO | MEK 50% | BYK-333 | ○ |
| Example 3 | A-600 | — | TPO | MEK 50% | BYK-333 | ○ |
| Example 4 | A-1000 | — | TPO | MEK 50% | BYK-333 | ○ |
| Example 5 | DPEA-12 | — | TPO | MEK 50% | BYK-333 | ○ |
| Example 6 | 1G | — | TPO | MEK 50% | BYK-333 | ○ |
| Example 7 | APG-100 | — | TPO | MEK 50% | BYK-333 | ○ |
| Example 8 | APG-200 | — | TPO | MEK 50% | BYK-333 | ○ |
| Example 9 | APG-400 | — | TPO | MEK 50% | BYK-333 | ○ |
| Example 10 | APG-700 | — | TPO | MEK 50% | BYK-333 | ○ |
| Example 11 | A-PTMG-65 | — | TPO | MEK 50% | BYK-333 | ○ |
| Example 12 | A-1000/DPEA-12 | — | TPO | MEK 50% | BYK-333 | ○ |
| Example 13 | DPEA-12/APG-700 | — | TPO | MEK 50% | BYK-333 | ○ |
| Example 14 | DPEA-12/A-PTMG-65 | — | TPO | MEK 50% | BYK-333 | ○ |
| Example 15 | A-1000 | — | 184 | MEK 50% | BYK-333 | ○ |
| Example 16 | DPEA-12 | — | 184 | MEK 50% | BYK-333 | ○ |
| Example 17 | A-1000/DPEA-12 | — | 184 | MEK 50% | BYK-333 | ○ |
| Example 18 | A-1000/DPEA-12 | — | 1173 | MEK 50% | BYK-333 | ○ |
| Example 19 | DPEA-12 | — | TPO | MIBX 50% | BYK-333 | ○ |
| Example 20 | DPEA-12 | — | TPO | EtOAc 50% | BYK-333 | ○ |
| Example 21 | DPEA-12 | — | TPO | CHN 50% | BYK-333 | ○ |
| Example 22 | DPEA-12 | — | TPO | PGME 50% | BYK-333 | ○ |
| Example 23 | A-1000/DPEA-12 | — | TPO | MEK 50% | BYK-307 | ○ |
| Example 24 | A-1000/DPEA-12 | — | TPO | MEK 50% | X-22-164AS | ○ |
| Example 25 | A-1000/DPEA-12 | — | TPO | MEK 50% | X-22-164E | ○ |
| Example 26 | A-1000/DPEA-12 | — | TPO | MEK 50% | X-22-1602 | ○ |
| Example 27 | A-1000/DPEA-12 | — | TPO | MEK 50% | X-22-2426 | ○ |
| Example 28 | A-1000/DPEA-12 | — | TPO | MEK 50% | X-22-2404 | ○ |
| Example 29 | A-1000/DPEA-12 | — | TPO | MEK 50% | X-24-8201 | ○ |
| Example 30 | A-1000/DPEA-12 | — | TPO | MEK 50% | FL100-100cs | ○ |
| Example 31 | A-1000/DPEA-12 | — | TPO | MEK 50% | FL100-450cs | ○ |
| Example 32 | A-1000/DPEA-12 | DPHA | TPO | MEK 50% | BYK-333 | ○ |
| Example 33 | A-1000/DPEA-12 | PET-30 | TPO | MEK 50% | BYK-333 | ○ |
| Example 34 | A-1000/DPEA-12 | A-DCP | TPO | MEK 50% | BYK-333 | ○ |
| Example 35 | A-1000/DPEA-12 | UA-306H | TPO | MEK 50% | BYK-333 | ○ |
| Example 36 | A-1000/DPEA-12 | UA-7100 | TPO | MEK 50% | BYK-333 | ○ |

TABLE 1-2

| | Component (A) | Component (E) | Component (B) | Component (C) | Component (D) | Determination |
|---|---|---|---|---|---|---|
| Example 37 | A-200 | — | TPO | MEK 20% | BYK-333 | ○ |
| Example 38 | A-200 | — | TPO | MEK 70% | BYK-333 | ○ |
| Example 39 | A-200 | — | TPO | MEK 50% | BYK-307 | ○ |
| Example 40 | A-200 | — | TPO | MEK 50% | X-22-164AS | ○ |
| Example 41 | A-200 | — | TPO | MEK 50% | X-22-164E | ○ |
| Example 42 | A-200 | — | TPO | MEK 50% | X-22-1602 | ○ |
| Example 43 | A-200 | — | TPO | MEK 50% | X-22-2426 | ○ |
| Example 44 | A-200 | — | TPO | MEK 50% | X-22-2404 | ○ |
| Example 45 | A-200 | — | TPO | MEK 50% | X-24-8201 | ○ |
| Example 46 | A-200 | — | TPO | MEK 50% | FL100-100cs | ○ |
| Example 47 | A-200 | — | TPO | MEK 50% | FL100-450cs | ○ |

TABLE 1-3

| | Component (A) | Component (E) | Component (B) | Component (C) | Component (D) | Determination |
|---|---|---|---|---|---|---|
| Comparative Example 15 | A-1000 | — | TPO | — | BYK-333 | x |
| Comparative Example 23 | A-200 | — | TPO | — | BYK-307 | x |
| Comparative Example 24 | A-200 | — | TPO | — | X-22-164AS | x |
| Comparative Example 25 | A-200 | — | TPO | — | X-22-164E | x |
| Comparative Example 27 | A-200 | — | TPO | — | X-22-2426 | x |
| Comparative Example 29 | A-200 | — | TPO | — | X-24-8201 | x |
| Comparative Example 31 | A-200 | — | TPO | — | FL100-450cs | x |
| Comparative Example 32 | A-200 | DPHA | TPO | — | X-22-164E | x |
| Comparative Example 33 | A-200 | PET-30 | TPO | — | X-22-2426 | x |
| Comparative Example 34 | A-200 | A-DCP | TPO | — | X-24-8201 | x |
| Comparative Example 35 | A-200 | UA-306H | TPO | — | FL100-100cs | x |
| Comparative Example 36 | A-200 | UA-7100 | TPO | — | FL100-450cs | x |

As shown in Table 1 (Tables 1-1 to 1-3), the imprint materials of Examples 1 to 47 could all be obtained in a transparent and homogeneous varnish form.

On the other hand, in Comparative Examples 1 to 60, the imprint materials which contained the silicone compound of the component (D), but did not contain the solvent of the component (C) failed to be obtained in a transparent and homogeneous varnish form (Comparative Example 15, Comparative Examples 23 to 25, Comparative Example 27, Comparative Example 29 and Comparative Examples 31 to 36).

In detail, when a comparison is made between: Comparative Example 15, Comparative Examples 23 to 25, Comparative Example 27, Comparative Example 29 and Comparative Example 31; and Example 4, Examples 39 to 41, Example 43, Example 45 and Example 47, which differ only in containing the solvent, the following results are obtained. That is, the kinds and addition amounts of the silicone compound of the component (D) were equal, but homogeneous varnishes could be obtained only when the solvent was added. In addition, it was confirmed that, in Comparative Examples 32 to 36, even when the acrylate compound or the urethane acrylate compound was added as another component, the imprint materials failed to be obtained in a homogenous varnish form, that is, the compatibility could not be improved simply by adding the above compound.

From the above results, it was confirmed that, when the solvent is not present, there are cases in which, depending on the kind, the silicone compound of the component (D) has a poor compatibility with other components, the compatibility does not improve even when the acrylate compound or the urethane acrylate compound is added as the other component (Comparative Examples 32 to 36), and the imprint material fails to form a transparent and homogeneous varnish form; that is, the presence of the solvent of the component (C) is important in order to reliably obtain imprint materials in a transparent and homogeneous varnish form when the silicone compound of the component (D) is combined.

[Photocurability Test]

Photocurability tests were carried out using the imprint materials of Examples 1 to 47 and Comparative Examples 1 to 11. In the photocurability tests, the obtained imprint materials were applied using a film applicator on triacetyl cellulose films (FUJITAC (registered trademark), manufactured by Fujifilm Corporation) (hereinafter referred to simply as "TAC film") so as to obtain a wet film thickness of 4 μm, and then dried for 30 seconds in a clean oven at 110° C. After that, the imprint material-coated sides of the TAC films were roller-pressed on a silicon substrate on which the mold release treatment had been carried out, and exposed to light on the TAC film side at 350 mJ/cm$^2$ using an electrodeless uniform radiation apparatus, thereby carrying out photocuring. After that, the TAC films and the silicon substrate were separated, and whether the imprint materials applied on the TAC film and irradiated with light were photocured or not was checked, based on the presence of tackiness on the exposed film surfaces. Note that, when an imprint material is not photocured, tackiness remains on the film surface and the film surface is deformed when touched with hands. Thus, when a pattern-transferred film is produced using the roll-to-roll processing, a disadvantage is caused during winding of the product (film) using a roll, and therefore the material is determined to be inappropriate as an imprint material.

Regarding the imprint materials of Examples 1 to 47, the exposed film surfaces did not exhibit tackiness and did not deform when touched with hands. On the other hand, regarding the imprint materials of Comparative Examples 1 to 11, which did not contain the photopolymerization initiator of the component (B), the exposed film surfaces exhibited tackiness.

Based on the above facts, it was clarified that the photopolymerization initiator of the component (B) is an essential component.

[Photo-Imprint and Mold Release Force Test]

The respective imprint materials obtained in Examples 1 to 47, Comparative Examples 12 to 14, Comparative Examples 16 to 22, Comparative Example 26, Comparative Example 28, Comparative Example 30 and Comparative Examples 37 to 60 were applied using a fully automatic film applicator on TAC films, poly(ethylene terephthalate) films (COSMOSHINE (registered trademark) A4100 manufactured by Toyobo Co., Ltd.) (hereinafter referred to simply as "PET films" in the specification) and methyl polymethacrylate films (TECHNOLLOY (registered trademark) S001G, manufactured by Sumitomo Chemical Co., Ltd.) (hereinafter referred to simply as "PMMA films" in the specification) so as to obtain a wet film thickness of 4 μm, and then dried for 30 seconds in a clean oven at 110° C. Subsequently, the coated surfaces (coating films) of the imprint materials of the respective films were roller-pressed on a moth-eye patterned mold on which the mold release treatment had been carried out, and exposed to light on the film side at 350 mJ/cm$^2$ using an electrodeless uniform radiation apparatus, thereby carrying out photocuring. In addition, 90° detachment tests with reference to JIS Z0237 were carried out, and loads when the cured films formed on the respective film base materials and attached to the surface of the mold, which had the pattern shape, were completely detached from the surface of the mold, which had the pattern shape, were measured. In addition, the load per 1 cm of the width of the film was calculated, and used as a mold release force (g/cm). The obtained results are described in Table 2 (Tables 2-1 to 2-4).

Note that, after the mold release test, attachment of organic substances was not visually confirmed in the mold in the above Examples and Comparative Examples. In the films having the formed pattern transferred from the mold as well, peeling and defects were not visually confirmed.

[Adhesion Test]

After carrying out the [photo-imprint and mold release force test], the adhesions between the respective film base materials and the pattern-formed films were tested. The adhesion test was carried out in the following order in accordance with JIS K5400.

First, grid-shaped cuts were made in the pattern-formed films so as to reach the film base material using a cutter so that 100 cells at 1 mm intervals were provided. An approximately 50 mm-long tape was attached on the grid-shaped cells, and instantaneously peeled off at 90° with respect to the film.

After the peel-off of the tape, the cells were observed, the number of cells out of 100 from which the film had not been peeled off was indicated by x, and the adhesion was evaluated as x/100. The adhesion test was repeated 3 times, and the average value of the respective evaluations was calculated. The obtained results are shown in Table 2 (Tables 2-1 to 2-4).

TABLE 2-1

|  | TAC films | | PET films | | PMMA films | |
| --- | --- | --- | --- | --- | --- | --- |
|  | Adhesion test result | Mold release force [g/cm] | Adhesion test result | Mold release force [g/cm] | Adhesion test result | Mold release force [g/cm] |
| Example 1 | 100/100 | 0.25 | 100/100 | 0.25 | 100/100 | 0.25 |
| Example 2 | 100/100 | 0.25 | 100/100 | 0.25 | 100/100 | 0.30 |
| Example 3 | 100/100 | 0.25 | 100/100 | 0.25 | 100/100 | 0.25 |
| Example 4 | 100/100 | 0.25 | 100/100 | 0.25 | 100/100 | 0.25 |
| Example 5 | 100/100 | 0.30 | 100/100 | 0.30 | 100/100 | 0.25 |
| Example 6 | 100/100 | 0.30 | 100/100 | 0.30 | 100/100 | 0.30 |
| Example 7 | 100/100 | 0.30 | 100/100 | 0.30 | 100/100 | 0.25 |
| Example 8 | 100/100 | 0.30 | 100/100 | 0.30 | 100/100 | 0.25 |
| Example 9 | 100/100 | 0.30 | 100/100 | 0.30 | 100/100 | 0.30 |
| Example 10 | 100/100 | 0.25 | 100/100 | 0.25 | 100/100 | 0.25 |
| Example 11 | 100/100 | 0.35 | 100/100 | 0.35 | 100/100 | 0.35 |
| Example 12 | 100/100 | 0.25 | 100/100 | 0.25 | 100/100 | 0.25 |
| Example 13 | 100/100 | 0.25 | 100/100 | 0.30 | 100/100 | 0.30 |
| Example 14 | 100/100 | 0.25 | 100/100 | 0.25 | 100/100 | 0.25 |
| Example 15 | 100/100 | 0.25 | 100/100 | 0.30 | 100/100 | 0.30 |
| Example 16 | 100/100 | 0.30 | 100/100 | 0.30 | 100/100 | 0.25 |
| Example 17 | 100/100 | 0.30 | 100/100 | 0.30 | 100/100 | 0.30 |
| Example 18 | 100/100 | 0.30 | 100/100 | 0.30 | 100/100 | 0.30 |
| Example 19 | 100/100 | 0.30 | 100/100 | 0.30 | 100/100 | 0.30 |
| Example 20 | 100/100 | 0.30 | 100/100 | 0.30 | 100/100 | 0.30 |
| Example 21 | 100/100 | 0.30 | 100/100 | 0.30 | 100/100 | 0.30 |
| Example 22 | 100/100 | 0.30 | 100/100 | 0.30 | 100/100 | 0.30 |
| Example 23 | 100/100 | 0.30 | 100/100 | 0.30 | 100/100 | 0.30 |
| Example 24 | 100/100 | 0.30 | 100/100 | 0.30 | 100/100 | 0.30 |
| Example 25 | 100/100 | 0.30 | 100/100 | 0.30 | 100/100 | 0.30 |
| Example 26 | 100/100 | 0.30 | 100/100 | 0.30 | 100/100 | 0.30 |

TABLE 2-1-continued

|  | TAC films | | PET films | | PMMA films | |
|---|---|---|---|---|---|---|
|  | Adhesion test result | Mold release force [g/cm] | Adhesion test result | Mold release force [g/cm] | Adhesion test result | Mold release force [g/cm] |
| Example 27 | 100/100 | 0.30 | 100/100 | 0.30 | 100/100 | 0.30 |
| Example 28 | 100/100 | 0.30 | 100/100 | 0.30 | 100/100 | 0.30 |
| Example 29 | 100/100 | 0.30 | 100/100 | 0.30 | 100/100 | 0.30 |
| Example 30 | 100/100 | 0.30 | 100/100 | 0.30 | 100/100 | 0.30 |
| Example 31 | 100/100 | 0.30 | 100/100 | 0.30 | 100/100 | 0.30 |
| Example 32 | 100/100 | 0.35 | 100/100 | 0.35 | 100/100 | 0.35 |
| Example 33 | 100/100 | 0.30 | 100/100 | 0.35 | 100/100 | 0.35 |
| Example 34 | 100/100 | 0.35 | 100/100 | 0.35 | 100/100 | 0.35 |
| Example 35 | 100/100 | 0.30 | 100/100 | 0.30 | 100/100 | 0.30 |
| Example 36 | 100/100 | 0.30 | 100/100 | 0.30 | 100/100 | 0.30 |

TABLE 2-2

|  | TAC films | | PET films | | PMMA films | |
|---|---|---|---|---|---|---|
|  | Adhesion test result | Mold release force [g/cm] | Adhesion test result | Mold release force [g/cm] | Adhesion test result | Mold release force [g/cm] |
| Example 37 | 100/100 | 0.25 | 100/100 | 0.25 | 100/100 | 0.30 |
| Example 38 | 100/100 | 0.25 | 100/100 | 0.25 | 100/100 | 0.25 |
| Example 39 | 100/100 | 0.25 | 100/100 | 0.25 | 100/100 | 0.25 |
| Example 40 | 100/100 | 0.25 | 100/100 | 0.25 | 100/100 | 0.25 |
| Example 41 | 100/100 | 0.25 | 100/100 | 0.25 | 100/100 | 0.25 |
| Example 42 | 100/100 | 0.25 | 100/100 | 0.25 | 100/100 | 0.25 |
| Example 43 | 100/100 | 0.25 | 100/100 | 0.25 | 100/100 | 0.25 |
| Example 44 | 100/100 | 0.25 | 100/100 | 0.25 | 100/100 | 0.25 |
| Example 45 | 100/100 | 0.25 | 100/100 | 0.25 | 100/100 | 0.25 |
| Example 46 | 100/100 | 0.25 | 100/100 | 0.25 | 100/100 | 0.25 |
| Example 47 | 100/100 | 0.25 | 100/100 | 0.25 | 100/100 | 0.25 |

TABLE 2-3

|  | TAC films | | PET films | | PMMA films | |
|---|---|---|---|---|---|---|
|  | Adhesion test result | Mold release force [g/cm] | Adhesion test result | Mold release force [g/cm] | Adhesion test result | Mold release force [g/cm] |
| Comparative Example 12 | 0/100 | — | 0/100 | — | 90/100 | — |
| Comparative Example 13 | 0/100 | — | 0/100 | — | 94/100 | — |
| Comparative Example 14 | 0/100 | — | 0/100 | — | 90/100 | — |
| Comparative Example 16 | 0/100 | — | 0/100 | — | 90/100 | — |
| Comparative Example 17 | 0/100 | — | 0/100 | — | 90/100 | — |
| Comparative Example 18 | 0/100 | — | 0/100 | — | 90/100 | — |
| Comparative Example 19 | 0/100 | — | 0/100 | — | 94/100 | — |
| Comparative Example 20 | 0/100 | — | 0/100 | — | 90/100 | — |
| Comparative Example 21 | 0/100 | — | 0/100 | — | 92/100 | — |
| Comparative Example 22 | 0/100 | — | 0/100 | — | 94/100 | — |
| Comparative Example 26 | 0/100 | — | 0/100 | — | 94/100 | — |
| Comparative Example 28 | 0/100 | — | 0/100 | — | 94/100 | — |
| Comparative Example 30 | 0/100 | — | 0/100 | — | 94/100 | — |

TABLE 2-4

| | TAC films | | PET films | | PMMA films | |
|---|---|---|---|---|---|---|
| | Adhesion test result | Mold release force [g/cm] | Adhesion test result | Mold release force [g/cm] | Adhesion test result | Mold release force [g/cm] |
| Comparative Example 37 | 100/100 | 0.60 | 100/100 | 0.55 | 100/100 | 0.60 |
| Comparative Example 38 | 100/100 | 0.60 | 100/100 | 0.55 | 100/100 | 0.60 |
| Comparative Example 39 | 100/100 | 0.55 | 100/100 | 0.55 | 100/100 | 0.60 |
| Comparative Example 40 | 100/100 | 0.55 | 100/100 | 0.55 | 100/100 | 0.60 |
| Comparative Example 41 | 100/100 | 0.55 | 100/100 | 0.55 | 100/100 | 0.55 |
| Comparative Example 42 | 100/100 | 0.55 | 100/100 | 0.55 | 100/100 | 0.55 |
| Comparative Example 43 | 100/100 | 0.55 | 100/100 | 0.55 | 100/100 | 0.55 |
| Comparative Example 44 | 100/100 | 0.55 | 100/100 | 0.55 | 100/100 | 0.55 |
| Comparative Example 45 | 100/100 | 0.55 | 100/100 | 0.55 | 100/100 | 0.55 |
| Comparative Example 46 | 100/100 | 0.55 | 100/100 | 0.55 | 100/100 | 0.55 |
| Comparative Example 47 | 100/100 | 0.60 | 100/100 | 0.65 | 100/100 | 0.65 |
| Comparative Example 48 | 100/100 | 0.55 | 100/100 | 0.60 | 100/100 | 0.60 |
| Comparative Example 49 | 100/100 | 0.80 | 100/100 | 0.85 | 100/100 | 0.80 |
| Comparative Example 50 | 100/100 | 0.55 | 100/100 | 0.60 | 100/100 | 0.55 |
| Comparative Example 51 | 100/100 | 0.80 | 100/100 | 0.80 | 100/100 | 0.80 |
| Comparative Example 52 | 100/100 | 0.55 | 100/100 | 0.55 | 100/100 | 0.55 |
| Comparative Example 53 | 100/100 | 0.75 | 100/100 | 0.75 | 100/100 | 0.75 |
| Comparative Example 54 | 82/100 | — | 86/100 | — | 98/100 | — |
| Comparative Example 55 | 86/100 | — | 90/100 | — | 99/100 | — |
| Comparative Example 56 | 8/100 | — | 16/100 | — | 95/100 | — |
| Comparative Example 57 | 32/100 | — | 35/100 | — | 96/100 | — |
| Comparative Example 58 | 86/100 | — | 87/100 | — | 98/100 | — |
| Comparative Example 59 | 0/100 | — | 0/100 | — | 32/100 | — |
| Comparative Example 60 | 0/100 | — | 0/100 | — | 23/100 | — |

The imprint materials of Examples 1 to 47 could be prepared in a transparent and homogenous varnish form as shown in Table 1, did not exhibit tackiness after photocuring in the [photocurability test], furthermore, as shown in Table 2, could exhibit a perfect adhesion of 100/100 in the cross-cut test, and realized a mold release force of larger than 0 g/cm to 0.5 g/cm or less. That is, the obtained results showed that the materials of Examples 1 to 47 are extremely preferable as imprint materials.

On the other hand, the obtained results showed that the imprint materials of Comparative Examples 12 to 14, Comparative Examples 16 to 22, Comparative Example 26, Comparative Example 28 and Comparative Example 30, that is, the imprint materials that did not contain the solvent of the component (C), could be prepared in a transparent and homogeneous varnish form as shown in Table 1, but exhibited 0/100 in the adhesion evaluation with respect to the TAC film, PET film and PMMA film using the cross-cut tests, and did not exhibit any adhesion.

In addition, the results showed that in the imprint materials of Comparative Examples 54 to 58 in which the proportion of the solvent of the component (C) was decreased and the concentration of the solid content was set to 90% by mass, the adhesions to the film base materials were, conversely, degraded.

The imprint materials of Comparative Examples 59 and 60 in which other solvents (IPA and Tol) were used instead of the solvent of the component (C) did not exhibit any adhesion (0/100).

The results also showed that the imprint materials of Comparative Examples 37 to 48 which contained the solvent of the component (C) realized the perfect adhesion (100/100) with respect to the film base materials, but failed to achieve a mold release force of 0.5 g/cm or less since the imprint material did not contain the silicone compound of the component (D), and the mold release forces were large (0.55 g/cm or more).

The results also showed that the imprint materials of Comparative Examples 49 to 53 which did not contain the component (A) but only contained the component (E), which was an optional component, as a single body failed to achieve a mold release force of 0.5 g/cm or less, and exhibited an extremely large mold release force of a maximum of 0.85 g/cm.

The above results show that the appropriate selection and use of an appropriate amount of the solvent of the component (C) realizes high adhesion between the film base material and the film formed of the imprint material, the presence of the silicone compound of the component (D) is considered to be essential for decreasing the mold release force of the photocured cured film, and the compound of the component (A) containing the alkylene oxide unit having carbon atom number of 2, 3 or 4 and at least two polymerizable groups is extremely effective to decrease the mold release force.

INDUSTRIAL APPLICABILITY

A film obtained using the imprint material of the present invention is a composition that satisfies a high adhesion and is easily releasable from a mold when a structure is produced on a film base material using the roll-to-roll processing. The film can be preferably used for products such as solid-state imaging devices, solar cells, LED devices, displays and the like.

The invention claimed is:

1. An imprint material comprising:
   a component (A): a compound containing at least one alkylene oxide unit having carbon atom number of 2, 3 or 4 and at least two polymerizable groups;
   a component (B): a photopolymerization initiator;
   a component (C): a solvent that swells or dissolves a surface portion of a film base material to which the imprint material is applied; and
   a component (D): a silicone compound, wherein
   a proportion of a solid content defined as all the components of the imprint material excluding the component (C) is 10% by mass to 80% by mass with respect to a total mass of the imprint material.

2. The imprint material according to claim 1, wherein the compound of the component (A) is a compound that contains two or more of at least one group selected from a group consisting of an acryloyloxy group, a methacryloyloxy group, a vinyl group and an allyl group as the polymerizable groups.

3. The imprint material according to claim 1, wherein the compound of the component (A) is a compound that contains one or more of at least one selected from ethylene oxide, propylene oxide and butylene oxide as the alkylene oxide unit.

4. The imprint material according to claim 1, wherein the component (B) includes 2,4,6-trimethylbenzoyl-diphenyl-phosphine oxide, 1-hydroxy-cyclohexyl-phenyl-ketone or 2-hydroxy-2-methyl-1-phenyl-propane-1-one.

5. The imprint material according to claim 1, wherein the component (C) contains at least one selected from a group consisting of methyl ethyl ketone, methyl isobutyl ketone, ethyl acetate, cyclohexanone and propylene glycol monomethyl ether.

6. The imprint material according to claim 1, wherein the film base material is made of triacetyl cellulose, poly(ethylene terephthalate), poly(methylmethacrylate) or cycloolefin (co)polymer.

7. The imprint material according to claim 1, wherein adhesion between a cured film obtained when the imprint material is applied on the film base material and photocured and the film base material is 100/100 in a test evaluation in accordance with JIS K5400, and in a test in which the imprint material is applied on the film base material, a coating film on the film base material is adhered to a surface of a mold, which has a pattern shape, subsequently, the coating film is photocured, and then the cured coating film on the film base material is detached from the surface of the mold which has a pattern shape at 90°, a measured mold release force, that is, a value obtained by converting a load required to detach the cured coating film on the film base material from the surface of the mold, which has a pattern shape, into a load per 1 cm of a lateral width of the film base material, is larger than 0 g/cm to 0.5 g/cm or less.

8. An imprint method comprising:
   a step of applying the imprint material according to claim 1 on a film base material so as to obtain a coating film;
   a step of drying the coating film;
   a step of pressing a mold against the dried coating film and applying pressure, or of heating the dried coating film while pressing the mold against the coating film and applying pressure;
   a step of radiating light that cures the coating film with the coating film and the mold being in contact with each other so as to form a cured film; and
   a step of detaching the formed cured film from the mold.

9. The imprint method according to claim 8, wherein in the drying step, a drying temperature is selected from a range of 60° C. to 150° C.

10. A film which is manufactured using the imprint material according to claim 1, and has a pattern transferred thereto.

11. An optical member comprising the pattern-transferred film according to claim 10 on a base material.

12. A solid-state imaging device comprising the pattern-transferred film according to claim 10 on a base material.

13. An LED device comprising the pattern-transferred film according to claim 10 on a base material.

14. A semiconductor element comprising the pattern-transferred film according to claim 10.

15. A solar cell comprising the pattern-transferred film according to claim 10.

16. A display comprising the pattern-transferred film according to claim 10.

17. An electronic device comprising the pattern-transferred film according to claim 10.

* * * * *